US011869913B2

(12) United States Patent
Keum et al.

(10) Patent No.: US 11,869,913 B2
(45) Date of Patent: Jan. 9, 2024

(54) PIXEL ARRAY OF IMAGE SENSOR AND METHOD OF MANUFACTURING THE SAME

(71) Applicant: Samsung Electronics Co., Ltd., Suwon-si (KR)

(72) Inventors: Dongmin Keum, Daegu (KR); Taehan Kim, Hwaseong-si (KR); Bumsuk Kim, Hwaseong-si (KR); Junsung Park, Hwaseong-si (KR); Kwanghee Lee, Hwaseong-si (KR); Yunki Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/703,217

(22) Filed: Mar. 24, 2022

(65) Prior Publication Data

US 2022/0384508 A1 Dec. 1, 2022

(30) Foreign Application Priority Data

Jun. 1, 2021 (KR) ........................ 10-2021-0070552
Aug. 4, 2021 (KR) ........................ 10-2021-0102325

(51) Int. Cl.

| | |
|---|---|
| ***H01L 27/146*** | (2006.01) |
| ***H01L 21/66*** | (2006.01) |
| ***H04N 25/40*** | (2023.01) |
| ***H04N 25/702*** | (2023.01) |

(52) U.S. Cl.

CPC ........ *H01L 27/14627* (2013.01); *H01L 22/20* (2013.01); *H01L 27/14685* (2013.01); *H04N 25/40* (2023.01); *H04N 25/702* (2023.01); *H01L 27/1463* (2013.01); *H01L 27/14621* (2013.01); *H01L 27/14645* (2013.01)

(58) Field of Classification Search

CPC ............... H01L 27/14627; H01L 22/20; H01L 27/14685; H01L 27/14621; H01L 27/1463; H01L 27/14645; H04N 25/40; H04N 25/702

See application file for complete search history.

(56) References Cited

U.S. PATENT DOCUMENTS

| | | | |
|---|---|---|---|
| 7,626,157 | B2 | 12/2009 | Kim |
| 10,002,893 | B2 | 6/2018 | Choi et al. |
| 10,341,595 | B2 | 7/2019 | Jung et al. |
| 10,425,632 | B2 | 9/2019 | Yamazaki |

(Continued)

FOREIGN PATENT DOCUMENTS

| | | |
|---|---|---|
| JP | 2020161648 A | 10/2020 |

*Primary Examiner* — Gevell V Selby

(74) *Attorney, Agent, or Firm* — Muir Patent Law, PLLC

(57) ABSTRACT

A pixel array of an image sensor includes a plurality of pixel groups. Each pixel group includes a plurality of unit pixels adjacent to each other and respectively including photoelectric conversion elements disposed in a semiconductor substrate, a color filter shared by the plurality of unit pixels, and a plurality of microlenses disposed on the color filter and having sizes different from each other such that the plurality of microlenses respectively focus an incident light to the photoelectric conversion elements included in the plurality of unit pixels. Deviations of sensing sensitivity of unit pixels are reduced and quality of images captured by the image sensor is enhanced by adjusting sizes of microlenses.

20 Claims, 25 Drawing Sheets

(56) References Cited

U.S. PATENT DOCUMENTS

| | | | | |
|---|---|---|---|---|
| 10,547,800 | B2 | 1/2020 | Hwang et al. | |
| 10,979,680 | B2 | 4/2021 | Lee et al. | |
| 2013/0076953 | A1* | 3/2013 | Sekine | H04N 23/63 348/311 |
| 2014/0218572 | A1* | 8/2014 | Ootsuka | H01L 27/14685 438/70 |
| 2015/0264325 | A1* | 9/2015 | Hirota | H04N 25/135 348/279 |
| 2018/0160067 | A1* | 6/2018 | Sakioka | H04N 25/134 |
| 2019/0081098 | A1* | 3/2019 | Lenchenkov | H04N 25/75 |
| 2020/0388643 | A1* | 12/2020 | Ma | H04N 25/134 |

* cited by examiner

620

| UPTT | UPTT | UPTT |
|---|---|---|
| UPTT | UPTT | UPTT |
| UPTT | UPTT | UPTT |

PIXEL ARRAY OF IMAGE SENSOR AND METHOD OF MANUFACTURING THE SAME

CROSS-REFERENCE TO RELATED APPLICATIONS

This U.S. non-provisional application claims priority under 35 USC § 119 to Korean Patent Application No. 10-2021-0070552, filed on Jun. 1, 2021, and Korean Patent Application No. 10-2021-0102325, filed on Aug. 4, 2021 in the Korean Intellectual Property Office (KIPO), the disclosures of which are incorporated by reference herein in their entirety.

BACKGROUND

1. Technical Field

Example embodiments relate generally to semiconductor integrated circuits, and more particularly to a pixel array of an image sensor of reducing deviations of sensing sensitivity of pixels and a method of manufacturing the pixel array.

2. Discussion of the Related Art

Complementary metal oxide semiconductor (CMOS) image sensors are solid-state sensing devices that use complementary metal oxide semiconductors. CMOS image sensors have lower manufacturing costs and lower power consumption compared with charge-coupled device (CCD) image sensors. Thus CMOS image sensors are used for various electronic appliances including portable devices such as, for example, smartphones and digital cameras.

A pixel array included in a CMOS image sensor may include a photoelectric conversion element in each pixel. The photoelectric conversion element generates an electrical signal that varies based on the quantity of incident light. The CMOS image sensor processes these electrical signals to synthesize an image. With the recent proliferation of high-resolution images, pixels included in the CMOS image sensors are becoming much smaller. However, when the pixels get smaller, deviations of sensing sensitivity of pixels are increasing due to crosstalk between pixels. The crosstalk includes optical crosstalk such that incident light on a pixel is transferred to neighboring pixels and an electrical crosstalk such that photo-electric charge generated in a pixel by the incident light is transferred to and/or affect neighboring pixels.

SUMMARY

Some example embodiments may provide a pixel array including microlenses capable of reducing deviations of sensing sensitivity of pixels, an image sensor including the pixel array and a method of manufacturing the pixel array.

According to example embodiments, a pixel array of an image sensor includes a plurality of pixel groups. Each pixel group includes a plurality of unit pixels adjacent to each other and respectively including photoelectric conversion elements disposed in a semiconductor substrate, a color filter shared by the plurality of unit pixels, and a plurality of microlenses disposed on the color filter and having sizes different from each other such that the plurality of microlenses respectively focus an incident light to the photoelectric conversion elements included in the plurality of unit pixels.

According to example embodiments, an image sensor includes a pixel array including a plurality of pixel groups configured to collect photo-induced charges generated by an incident light, a row driver configured to drive the pixel array row by row and a controller configured to control the pixel array and the row driver. Each pixel group includes a plurality of unit pixels adjacent to each other and respectively including photoelectric conversion elements disposed in a semiconductor substrate, a color filter shared by the plurality of unit pixels and a plurality of microlenses disposed on the color filter and having sizes different from each other such that the plurality of microlenses respectively focus the incident light to the photoelectric conversion elements included in the plurality of unit pixels.

According to example embodiments, a method of manufacturing a pixel array of an image sensor, includes, measuring sensing sensitivities of unit pixels using a first pixel array including the unit pixels and first microlenses having a uniform size, determining sizes of second microlenses respectively corresponding to the sensing sensitivities of the unit pixels, and manufacturing a second pixel array including the unit pixels and the second microlenses.

The pixel array, the image sensor and the manufacturing method according to example embodiments may reduce deviations of sensing sensitivity of unit pixels and enhance quality of images captured by the image sensor by adjusting sizes of microlenses.

BRIEF DESCRIPTION OF THE DRAWINGS

Example embodiments of the present disclosure will be more clearly understood from the following detailed description taken in conjunction with the accompanying drawings.

DETAILED DESCRIPTION OF THE EMBODIMENTS

Figure 1:
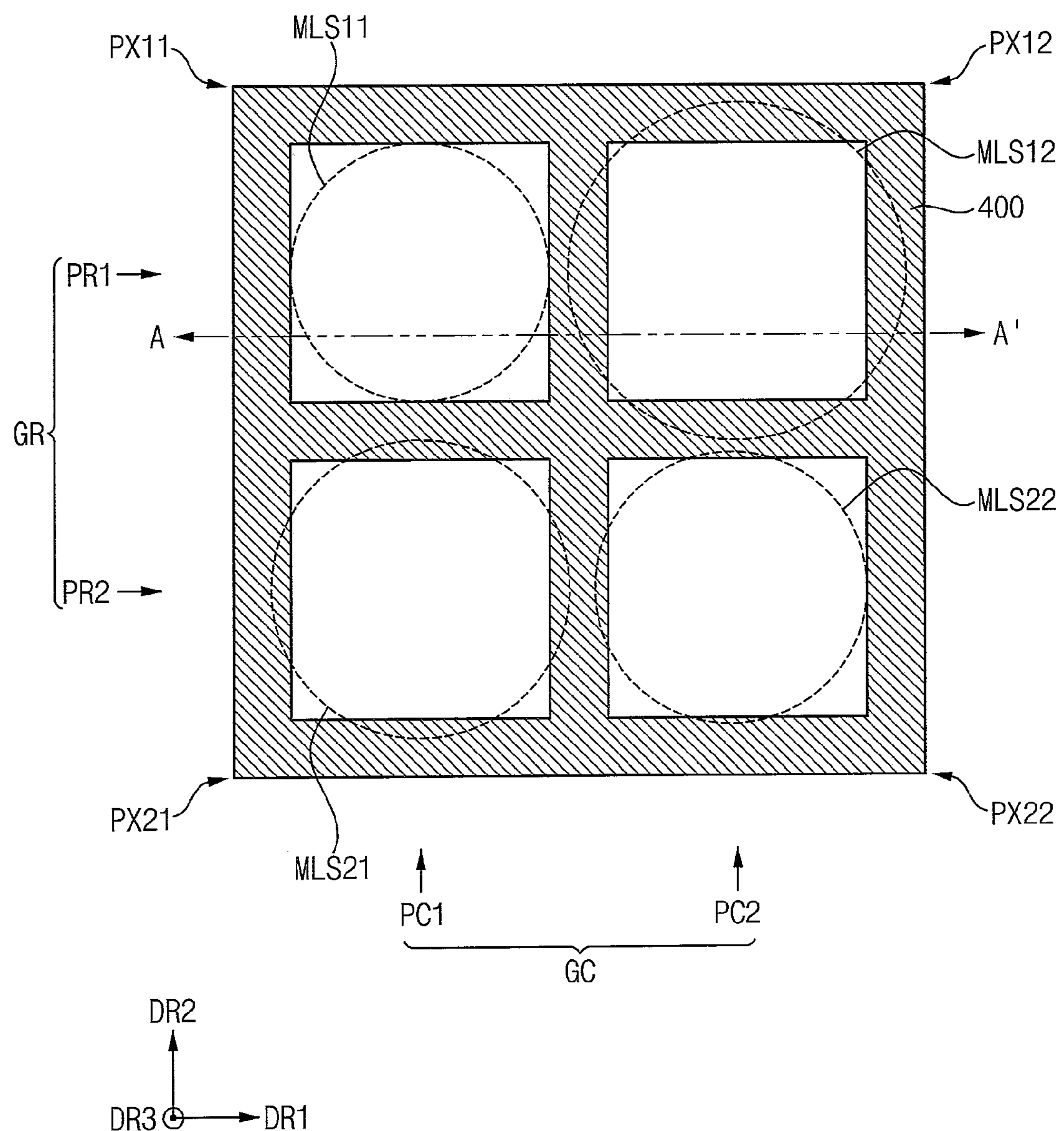
FIG. 1 is a plan view illustrating a layout of a pixel group included in a pixel array of an image sensor according to example embodiments.

Various example embodiments will be described more fully hereinafter with reference to the accompanying drawings, in which some example embodiments are shown. In the drawings, like numerals refer to like elements throughout. Repetitive descriptions may be omitted.

Hereinafter, structures according to example embodiments are described using a first horizontal direction DR1, a second horizontal direction DR2, and a vertical direction DR3 in a three-dimensional space. The first horizontal direction DR1 and the second horizontal direction DR2 may be substantially parallel with an upper surface of a semiconductor substrate and substantially perpendicular to each other. The vertical direction DR3 may be substantially perpendicular to the upper surface of the semiconductor substrate. The first direction DR1 may be a row direction and the second direction DR2 may be a column direction.

Terms such as "parallel," "perpendicular," "same," "equal," "planar," or "coplanar," as used herein encompass identicality or near identicality including variations that may occur, for example, due to manufacturing processes. The term "substantially" may be used herein to emphasize this meaning, unless the context or other statements indicate otherwise.

A pixel array of an image sensor according to example embodiments may include a plurality of pixel groups which are formed in a semiconductor substrate. In this disclosure, for convenience of illustration and description, example embodiments are described based on structures corresponding to a back-side illumination (BSI) image sensor such that a light is incident through a lower surface of a semiconductor substrate. However it will be understood that example embodiments may be applied to structures corresponding to a front-side illumination (FSI) image sensor such that a light is incident through an upper surface of a semiconductor substrate. In addition, microlenses of a circular shape are illustrated in figures for convenience of illustration, and the microlenses may have various shapes such as a rectangle, an ellipse, etc.

Figure 2:
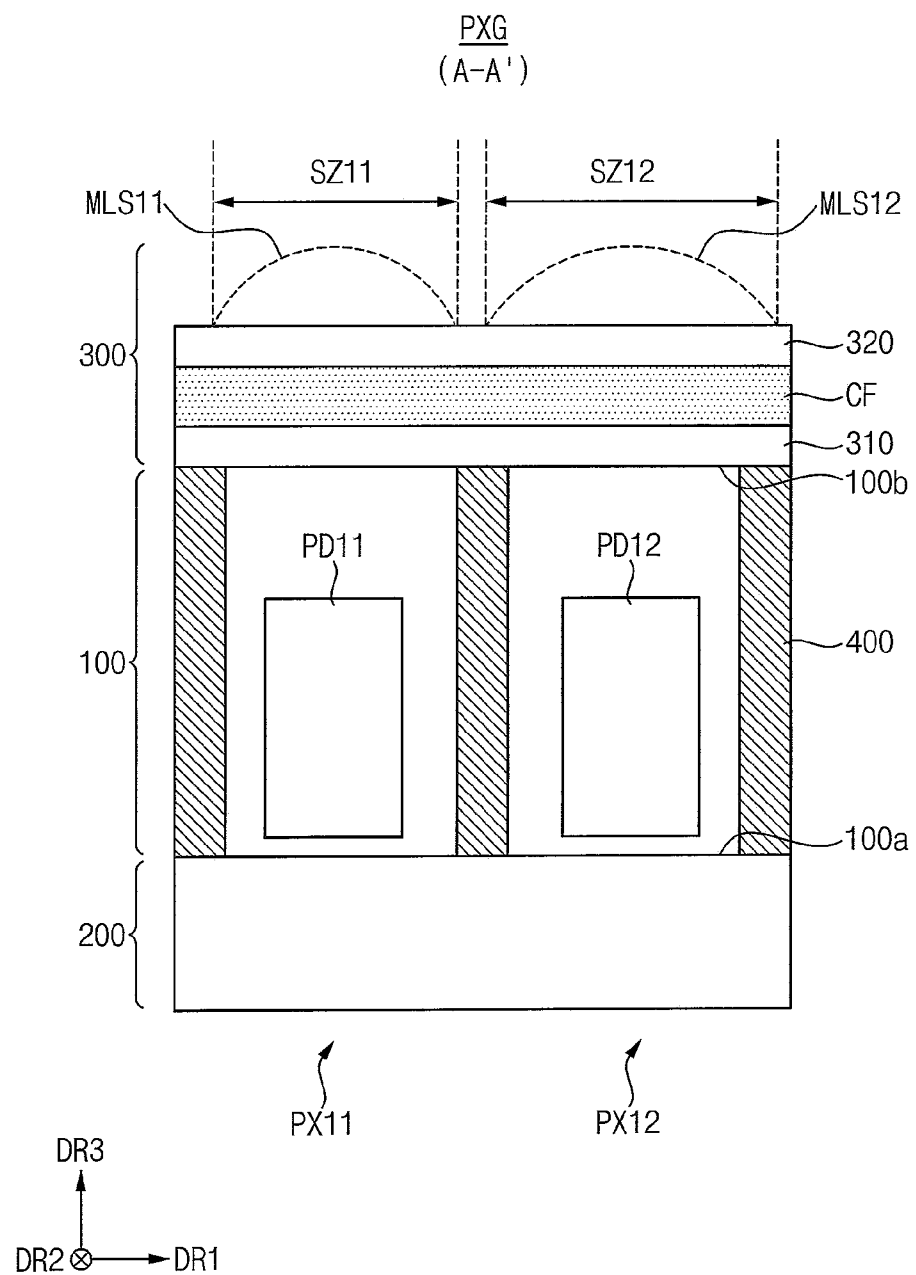
FIG. 2 is a cross-sectional view illustrating vertical structures of the pixel group of FIG. 1.

FIG. 1 is a plan view illustrating a layout of a pixel group included in a pixel array of an image sensor according to example embodiments, and FIG. 2 is a cross-sectional view illustrating vertical structures of the pixel group of FIG. 1. FIG. 2 is a cross-sectional view of the pixel group of FIG. 1 along line A-A'. Structures corresponding to one pixel group PXG among a plurality of pixel groups included in a pixel array are illustrated in FIGS. 1 and 2.

Referring to FIGS. 1 and 2, a pixel array may include a semiconductor substrate 100, an interconnection layer 200 and an optically-transparent layer 300 stacked in a vertical direction DR3. In case of the BSI structure, the semiconductor substrate 100 may be disposed between the interconnection layer 200 and the optically-transparent layer 300. For example, the semiconductor substrate 100 may have an upper surface 100*a* and a lower surface 100*b* on opposite sides thereof. The interconnection layer 200 may be disposed on the upper surface 100*a* of the semiconductor substrate 100, and the optically-transparent layer 300 may be disposed on the lower surface 100*b* of the semiconductor substrate 100.

Spatially relative terms, such as "beneath," "below," "lower," "above," "upper" and the like, may be used herein for ease of description to describe positional relationships, such as illustrated in the figures, e.g. FIGS. 2 and 4. It will be understood that the spatially relative terms encompass different orientations of the device in addition to the orientation depicted in the figures.

A pixel group PXG may include a plurality of unit pixels PX11, PX12, PX21 and PX22 (hereinafter, the plurality of unit pixels may be referenced as PX11~PX22), trench structures 400, and a plurality of microlenses MLS11, MLS12, MLS21 and MLS22 (hereinafter, the plurality of microlenses may be referred to as MLS11~MLS22).

FIG. 1 illustrates the pixel group PXG including the four unit pixels PX11~PX22 arranged in a matrix form of two pixel rows PR1 and PR2 and two pixel columns PC1 and PC2 for convenience of illustration and description. According to example embodiments, the number of unit pixels included in the pixel group PXG, e.g., the number of the pixel rows corresponding to one group row GR and the number of the pixel columns corresponding to one group column GC may vary. For example, more than two pixel rows may be present in one group row and/or more than two pixel columns may be present in one group column.

The unit pixels PX11~PX22 may respectively include photoelectric conversion elements PD11, PD12, PD21 and PD22 (hereinafter, the photoelectric conversion elements may be referenced as PD11~PD22) disposed in the semiconductor substrate 100. An incident light from the outside may be converted to electrical signals in the photoelectric conversion elements PD11~PD22.

The trench structures 400 may be disposed in the semiconductor substrate 100 and extend in the vertical direction DR3 from the upper surface 100*a* of the semiconductor substrate 100 to the lower surface 100*b* of the semiconductor substrate 100 to electrically and optically separate the photoelectric conversion elements PD11~PD22 from each other. For example, the trench structures 400 may reduce or prevent crosstalk phenomenon between the photoelectric conversion elements PD11~PD22. The photoelectric conversion elements PD11~PD22 may be elements generating photo-induced charges when light is incident on the photoelectric conversion elements PD11~PD22.

The optically-transparent layer 300 may include a color filter CF and the microlenses MLS11~MLS22. The optically-transparent layer 300 may be configured to allow external incident light to be filtered and focused on the semiconductor substrate 100. The color filter CF and the microlenses MLS11~MLS22 may be provided on the lower surface 100*b* of the semiconductor substrate 100. A first flattening layer 310 may be disposed between the lower surface of the semiconductor substrate 100 and the color filter CF, and a second flattening layer 320 may be disposed between the color filter CF and microlenses MLS11~MLS22.

The color filter CF may include or may be one of red, green, and blue filters. In some example embodiments, the color filter CF may include or may be one of cyan, magenta, and yellow filters. The unit pixels PX11~PX22 in the pixel group PXG may be unit pixels of the same color and share the single color filter CF. For example, unit pixels PX11~PX22 of one pixel group PXG may share a color filter formed of one color, and unit pixels PX11~PX22 of another pixel group PXG may share a color filter formed of another color.

The microlenses MLS11~MLS22 may respectively focus the incident light to the photoelectric conversion elements PD11~PD22 included in the unit pixels PX11~PX22. According to example embodiments, the microlenses MLS11~MLS22 may have respective sizes corresponding to sensing sensitivities of the unit pixels PX11~PX22.

In some example embodiments, each microlens of the plurality of microlenses MLS11~MLS22 may have a size that is inversely proportional to a sensing sensitivity of each unit pixel of the plurality of unit pixels PX11~PX22 corresponding to each microlens. For example, the sensing sensitivity of each unit pixel may be sensing sensitivity of the photoelectric conversion elements PD11~PD22 of the unit pixel.

In some example embodiments, a microlens corresponding to a unit pixel having a sensing sensitivity lower than an average sensing sensitivity of the plurality of unit pixels PX11~PX22 may have a size greater than an average size of the plurality of microlenses MLS11~MLS22, and a microlens corresponding to a unit pixel having a sensing sensitivity higher than the average sensing sensitivity has a size smaller than the average size.

For example, the plurality of unit pixels PX11~PX22 may include a first unit pixel PX11 having a first sensing sensitivity and a second unit pixel PX12 having a second sensing sensitivity lower than the first sensing sensitivity. The plurality of microlenses MLS11~MLS22 may include a first microlens MLS11 focusing the incident light to a photoelectric conversion element PD11 included in the first unit pixel PX11 and a second microlens MLS12 focusing the incident light to a photoelectric conversion element PD12 included in the second unit pixel PX12. In this case, a size of the first microlens MLS11 may be smaller than a size of the second microlens MLS12, as illustrated in FIGS. 1 and 2.

The plurality of unit pixels PX11~PX22 may have the same size. For example, the trench structures 400 may have a lattice structure of a uniform pitch in the first horizontal direction DR1 and the second horizontal direction DR2. In addition, the plurality of unit pixels PX11~PX22 may be formed with the same manufacturing processes and the same process conditions. All of the unit pixels PX11~PX22 are expected ideally to have the same sensing sensitivity, but in reality, the unit pixels PX11~PX22 may have different sensing sensitivities due to process deviations, etc. In addition, the sensing sensitivity of each unit pixel may be changed depending on the position in each pixel group because of the crosstalk between the neighboring pixel groups of the different colors.

In devices having a structure of a shared or merged color filter, the unit pixels sharing the merged color filter included in each pixel group are expected ideally to have the same sensing sensitivity. However, the unit pixels may have the different sensing sensitivities in reality due to the crosstalk with the neighboring unit pixels of the different color, and the deviations of the sensing sensitivity may affect image quality of an image sensor.

According to example embodiments, the deviations of the sensing sensitivity between the unit pixels sharing the same color filter may be compensated by adjusting the sizes of the microlenses. FIGS. 1 and 2 illustrate the four unit pixels PX11~PX22 sharing the same color filter CF for convenience of illustration and description. As will be further described below with reference to FIGS. 9 through 12, example embodiments may be applied to any pixel array in which two or more unit pixels share the same color filter.

As such, the deviations of sensing sensitivity of unit pixels may be reduced and quality of images captured by the image sensor may be enhanced/improved by adjusting the sizes of the microlenses.

The interconnection layer 200 may include logic transistors, which are electrically connected to the photoelectric conversion elements PD11~PD22, and interconnection lines, which are electrically connected to the logic transistors. The electrical signals converted in the photoelectric conversion elements PD11~PD22 may be transmitted to other circuitry (e.g., one of the logic transistors) through the interconnection layer 200. The interconnection layer 200 may include interlayered insulating layers, which are stacked in the vertical direction DR3, and interconnection lines, which are interposed between the interlayered insulating layers. The arrangement of the interconnection lines may be independent of the arrangement of the photoelectric conversion elements PD11~PD22. For example, the interconnection lines may be arranged to cross over the photoelectric conversion elements PD11~PD22. For example, while the interconnection lines may be electrically connected to the photoelectric conversion elements PD11~PD22, the shapes and/or arrangements of the interconnection lines may be designed differently from each other.

As used herein, components described as being "electrically connected" are configured such that an electrical signal can be transferred from one component to the other (although such electrical signal may be attenuated in strength as it transferred and may be selectively transferred).

The semiconductor substrate 100 may be formed from a bulk silicon wafer of a first conductivity type (e.g., p-type), on which an epitaxial layer of the first conductivity type is formed. In some example embodiments of the present disclosure, the bulk silicon substrate may be removed during a process of fabricating the image sensor, and in this case, the p-type epitaxial layer may be used as the semiconductor substrate 100. In some example embodiments of the present disclosure, the semiconductor substrate 100 may include a bulk semiconductor wafer, in which a well of the first conductivity type is formed. Various kinds of substrates (e.g., an n-type epitaxial layer, a bulk silicon wafer, and a silicon-on-insulator (SOI) wafer) may be used as the semiconductor substrate 100.

At least one floating diffusion region may be formed in the semiconductor substrate 100, and transfer gates may be disposed on the upper surface 100*a* of the semiconductor substrate 100 between the floating diffusion region and each of the photoelectric conversion elements PD11~PD22.

The photoelectric conversion elements PD11~PD22 may be impurity regions that are doped with impurities and may have a second conductivity type (e.g., n-type) different from that of the semiconductor substrate 100. In some example embodiments, the photoelectric conversion elements PD11~PD22 may be adjacent to the upper surface 100*a* of the semiconductor substrate 100 and may be spaced apart from the lower surface 100*b* of the semiconductor substrate 100. For example, the photoelectric conversion elements PD11~PD22 may be closer to the upper surface 100*a* of the semiconductor substrate 100 than the lower surface 100*b* of the semiconductor substrate 100. For example, the photoelectric conversion elements PD11~PD22 may be formed by injecting impurities of the second conductivity type (e.g., n-type) into the upper surface 100*a* of the semiconductor substrate 100. The photoelectric conversion elements PD11~PD22 may have a difference in doping concentration between regions adjacent to the upper and lower surfaces 100*a* and 100*b*, and thus, the semiconductor substrate 100 may have a potential difference between the upper surface 100*a* and the lower surface 100*b*.

In some example embodiments, the semiconductor substrate 100 of the first conductivity type and each of the photoelectric conversion elements PD11~PD22 may form a photodiode. For example, a junction serving as a photodiode may be formed between the semiconductor substrate 100 of the first conductivity type and each of the photoelectric conversion elements PD11~PD22. In the case where light is incident into the photoelectric conversion elements PD11~PD22, photocharges may be generated and stored in proportion to an intensity of the incident light. Furthermore, the photodiode may further include a p-type impurity region, which is doped with p-type impurities and is shallowly formed near the surfaces of the photoelectric conversion elements PD11~PD22.

Figure 3:
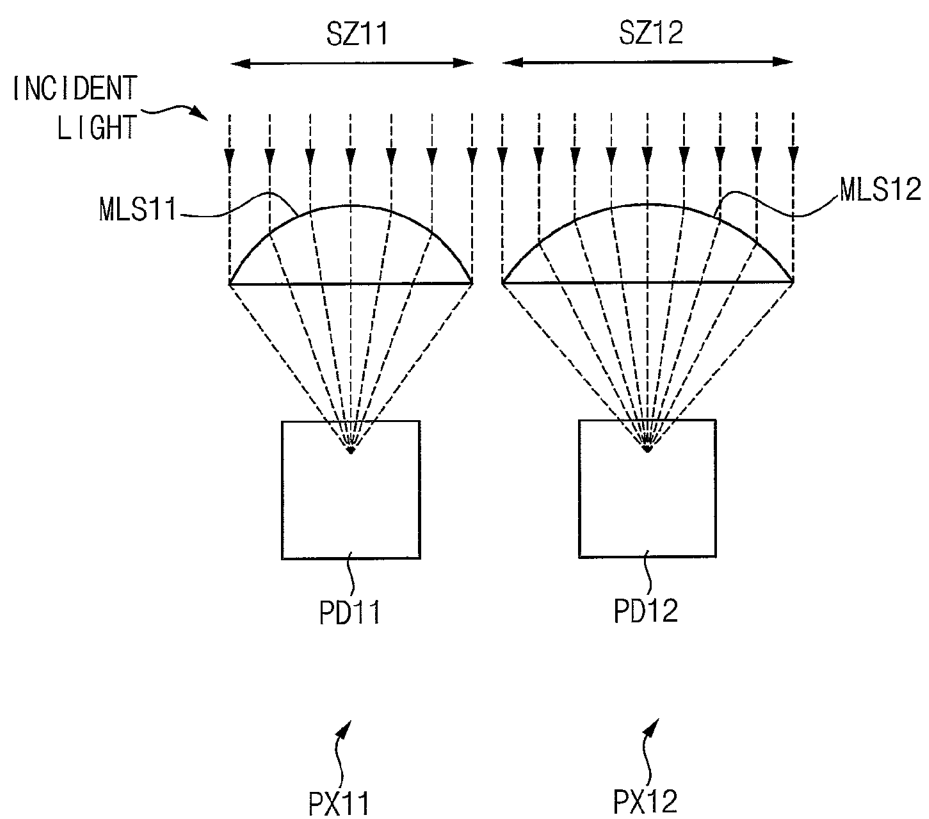
FIG. 3 is a diagram for describing reduction of deviations of sensing sensitivity between pixels according to example embodiments.

FIG. 3 is a diagram for describing reduction of deviations of sensing sensitivity between pixels according to example embodiments.

Referring to FIG. 3, a first unit pixel PX11 may have a first sensing sensitivity and a second unit pixel PX12 may have a second sensing sensitivity lower than the first sensing sensitivity. In this case, a first size SZ11 of a first microlens MLS11 corresponding to, e.g., vertically overlapping, the first unit pixel PX11 may be smaller than a second size SZ12 of a second microlens MLS12 corresponding to, e.g., vertically overlapping, the second unit pixel PX12.

The intensity of the incident light focused to a first photoelectric conversion element PD11 by the first microlens MLS11 having the smaller size SZ11 may be lower than the intensity of the incident light focused to a second photoelectric conversion element PD12 by the second microlens MLS12 having the larger size SZ12, e.g., when the incident light is uniform throughout the corresponding region. Accordingly, the first sensing sensitivity of the first unit pixel PX11 may be decreased relatively, the second sensing sensitivity of the second unit pixel PX12 may be increased relatively, and thus the deviation of sensing sensitivities of the first unit pixel PX11 and the second unit pixel PX12 may be reduced. For example, the sensitivity of the unit pixels PX11 and PX12 may be corrected by the micro lenses MLS11 and MLS12.

Figure 4A:
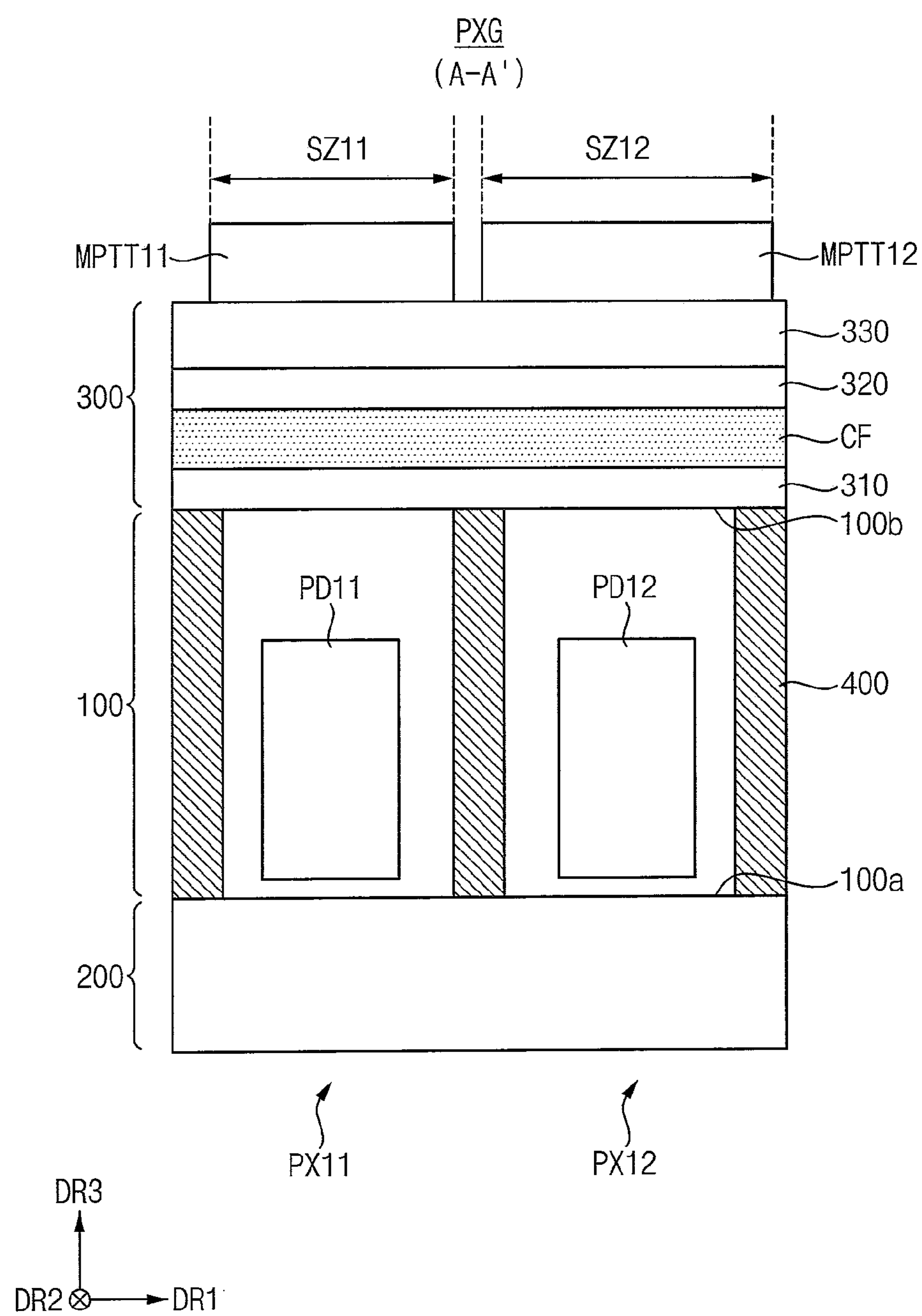
FIGS. 4A, 4B and 4C are diagrams illustrating manufacturing processes of a pixel array according to example embodiments.
Figure 4B:
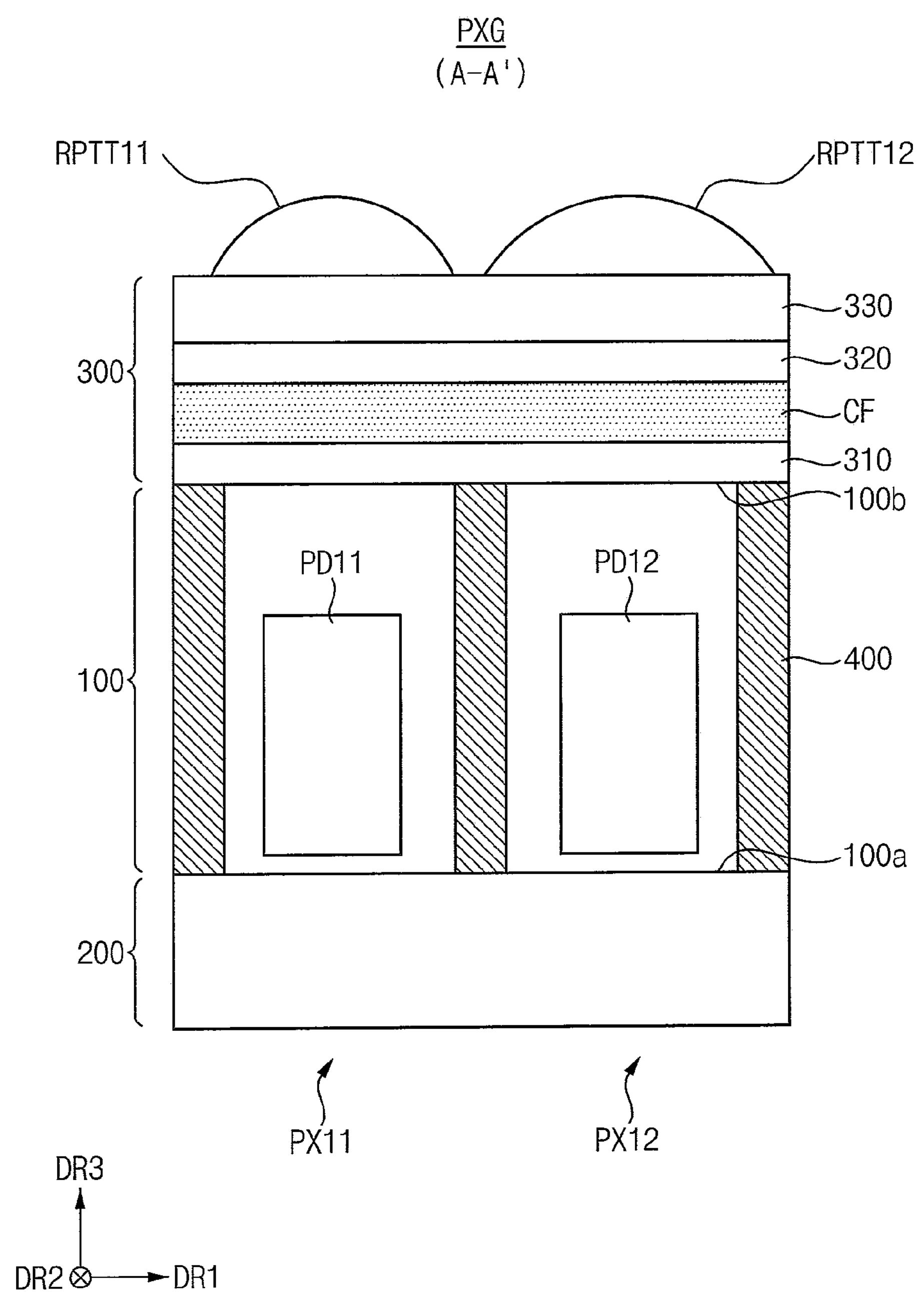
Figure 4C:
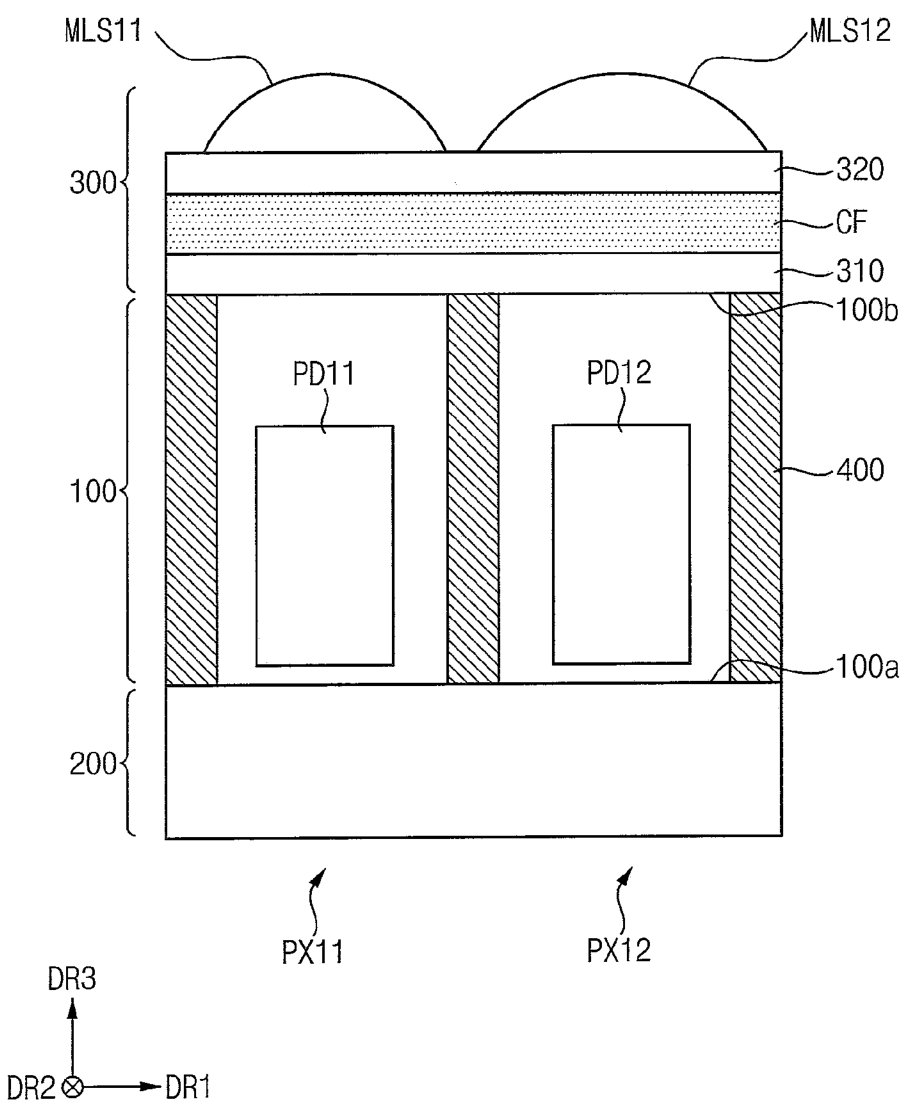

FIGS. 4A, 4B and 4C are diagrams illustrating manufacturing processes of a pixel array according to example embodiments. Hereinafter, descriptions repeated with the above descriptions with respect to FIGS. 1 and 2 may be omitted. The manufacturing processes of microlenses will be described below with reference to FIGS. 4A, 4B and 4C, and the manufacturing processes of other elements, which are well known to those skilled in the art, may be omitted.

Referring to FIG. 4A, a material layer 330 for microlenses are formed on the second flattening layer 320. The material layer 330 may include polyimide, SiN, SiO2, SiON, HfOx, TiO2, AL2O3, etc. In some example embodiments, the second flattening layer 320 may be omitted, and the material layer 330 may be formed on the color filter CF.

After that, mask patterns having sizes corresponding to the sensing sensitivities as described above may be formed on the material layer 330. For example, the first unit pixel PX11 may have the first sensing sensitivity and the second unit pixel PX12 may have the second sensing sensitivity lower than the first sensing sensitivity. In this case, as illustrated in FIG. 4A, a first size SZ11 of a first mask pattern MPTT11 corresponding to, e.g., formed in, the first unit pixel PX11 may be smaller than a second size SZ12 of a second mask pattern MPTT12 corresponding to, e.g., formed in, the second unit pixel PX12. For example, the sensitivities of the photoelectric conversion elements PD11~PD22 may be provided from a database formed by previously measured data. In certain embodiments, the sensitivities of the photoelectric conversion elements PD11~PD22 may be measured before forming the mask patterns MPTT11 and MPTT12.

The mask patterns MPTT11 and MPTT12 may be formed by a photolithography process and may include a photosensitive resist. As illustrated in FIGS. 4A and 4B, the first mask pattern MPTT11 may be formed at a position corresponding to the first unit pixel PX11 and the second mask pattern MPTT12 may be formed at a position corresponding to the second unit pixel PX12, such that the mask patterns MPTT11 and MPTT12 may be spaced apart from each other.

Referring to FIG. 4B, after forming of the mask patterns MPTT11 and MPTT12, a reflow process is performed to form reflow patterns RPTT11 and RPTT12. The reflow process may be performed by using, for example, blank exposure in which a stepper is utilized, and a thermal process. As illustrated in FIG. 4B, the reflow patterns RPTT11 and RPTT12 after the reflow process may have a shape similar to a hemisphere.

Referring to FIG. 4C, the microlenses MLS11 and MLS12 may be formed by using the reflow patterns RPTT11 and RPTT12 as a mask and performing an etchback process. The etchback process may be performed until the reflow patterns RPTT11 and RPTT12 are completely removed. Through the etchback process using the reflow patterns RPTT11 and RPTT12, the microlenses MLS11 and MLS12 may have a shape protruding upward. For example, the shape of the reflow patterns RPTT11 and RPTT12 may be transferred as is to the material layer 330 through the etchback process, the microlenses MLS11 and MLS12 may be formed with the shape similar to that of the reflow patterns RPTT11 and RPTT12.

As such, the microlenses MLS11 and MLS12 having the sizes SZ11 and SZ12 respectively corresponding to the sensing sensitivities of the unit pixels PX11 and PX12 may be formed by forming the mask patterns MPTT11 and MPTT12 having the sizes respectively corresponding to the sensing sensitivities of the unit pixels PX11 and PX12 and forming the microlenses MLS11 and MLS12 by performing the reflow process and the etchback process using the mask patterns MPTT11 and MPTT12.

Figure 5A:
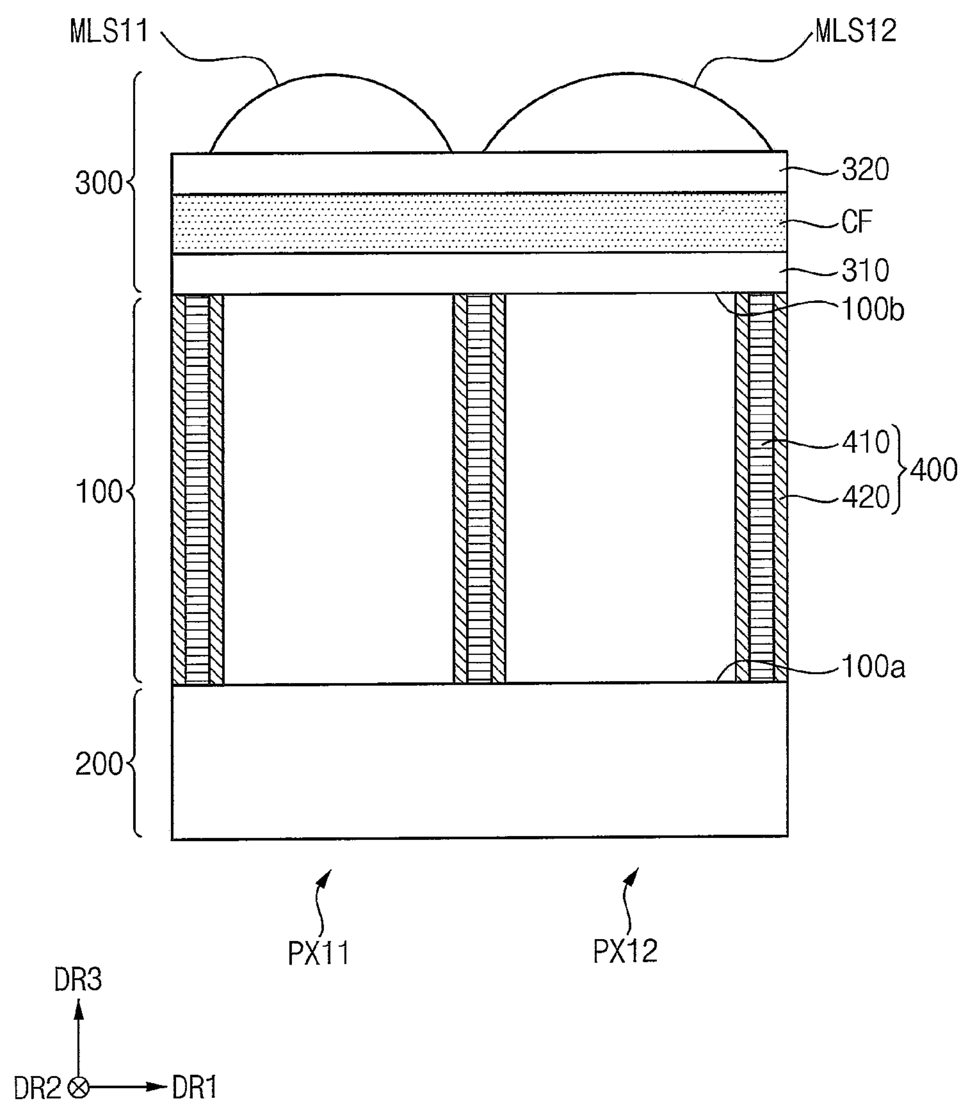
FIGS. 5A and 5B are cross-sectional views illustrating example embodiments of a trench structure of a pixel group included in a pixel array of an image sensor according to example embodiments.
Figure 5B:
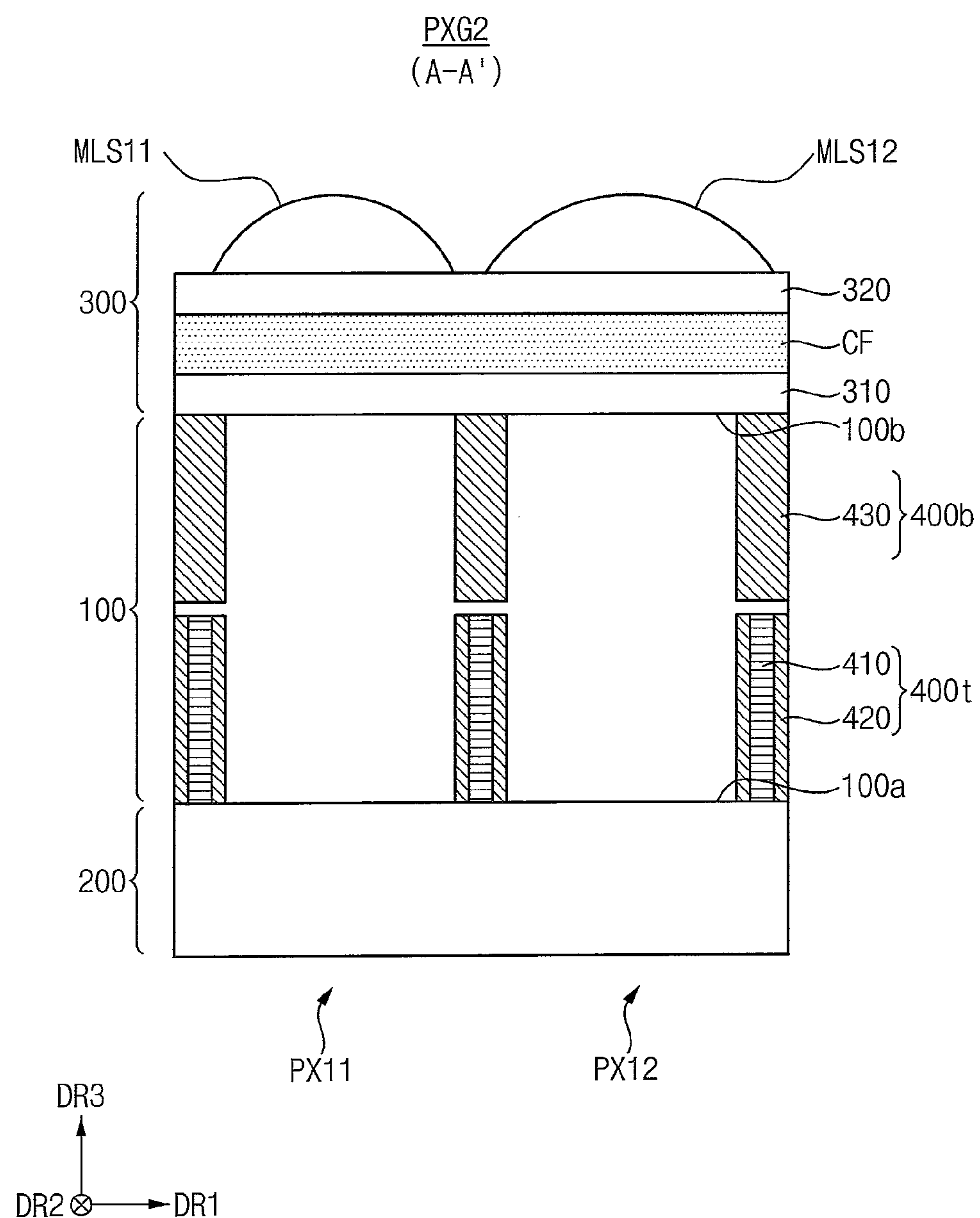

FIGS. 5A and 5B are cross-sectional views illustrating example embodiments of a trench structure of a pixel group included in a pixel array of an image sensor according to example embodiments. FIGS. 5A and 5B are cross-sectional views of the pixel group of FIG. 1 along line A-A'. Structures corresponding to one pixel group PXG among a plurality of pixel groups included in a pixel array are illustrated in FIGS. 5A and 5B. Hereinafter, descriptions repeated with the above descriptions with respect to FIGS. 1 and 2 may be omitted.

The trench structures 400 may be formed of an insulating material having a refractive index lower than that of the semiconductor substrate 100 (e.g., of silicon), and may include one or more insulating layers. For example, the trench structures 400 may be formed of or include at least one of a silicon oxide layer, a silicon nitride layer, an undoped poly-silicon layer, air, or combinations thereof. The formation of the trench structures 400 may include removing portions of the upper surface 100*a* and/or the lower surface 100*b* of the semiconductor substrate 100 to form a deep trench and filling the deep trench with an insulating material. For example, the trench structures 400 may be dielectric/insulator patterns formed in the deep trench.

The trench structures 400 may be disposed in the semiconductor substrate 100 and extend in the vertical direction DR3 from the upper surface 100*a* of the semiconductor substrate 100 to the lower surface 100*b* of the semiconductor substrate 100 to electrically and optically separate the photoelectric conversion elements PD11~PD22 from each other.

In some example embodiments, as a pixel group PXG1 illustrated in FIG. 5A, each of the trench structures 400 may include a trench such that inner surfaces of the trench are coated with a transparent dielectric material 420 and an inner space of the trench is filled with a material 410 different from the transparent dielectric material 420. For example, the transparent dielectric material 420 may be an oxide and the material 410 may be a nitride. For example, the trench structures 400 may have ONO (oxide-nitride-oxide) structure in the horizontal directions DR1 and DR2. In some example embodiments, each of the trench structures 400 may include a trench such that the entire portion of the trench is filled with the transparent dielectric material 420.

In some example embodiments, as a pixel group PXG2 illustrated in FIG. 5B, each of the trench structures 400 may include an upper trench structure 400*t* formed by a front trench process from the upper surface 100*a* of the semiconductor substrate 100, and a lower trench structure 400*b* formed by a back trench process from the lower surface 100*b* of the semiconductor substrate 100. For example, the front trench may be open toward the upper surface 100*a*, and the back trench may be open toward the lower surface 100*b*.

In some example embodiments, the upper trench structure 400*t* has a structure or a composition different from the lower trench structure 400*b*. For example, as the pixel group PXG2 illustrated in FIG. 5B, the upper trench structure 400*t* may include a trench such that inner surfaces of the trench are coated with a transparent dielectric material 420 and an inner space of the trench is filled with a material 410 different from the transparent dielectric material 420, whereas the lower trench structure 400*b* includes a trench that is filled with a transparent dielectric material 430.

Figure 6:
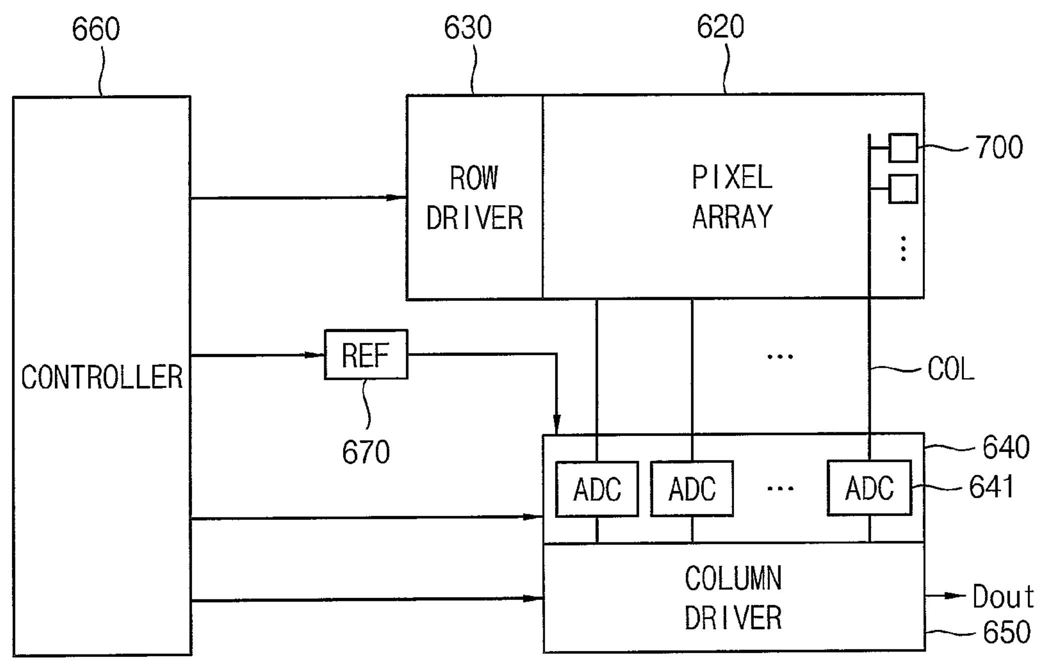
FIG. 6 is a block diagram illustrating an image sensor according to example embodiments.

FIG. 6 is a block diagram illustrating an image sensor according to example embodiments.

Referring to FIG. 6, an image sensor 600 may include a pixel array 620, a row driver 630, an analog-to-digital conversion circuit 640, a column driver 650, a controller 660, and a reference signal generator REF 670.

The pixel array 620 includes a plurality of pixels 700 coupled to column lines COL, respectively, and the plurality of pixels 700 senses incident light to generate analog signals through the column lines COL. For example, the electric charge generated in the photoelectric conversion elements by the incident light may be transferred through the column lines COL. The plurality of pixels 700 may be arranged in a matrix form with a plurality of rows and a plurality of columns. The pixel array 620 may have a structure that various unit patterns, which will be described below with reference to FIGS. 9 through 12, are arranged repeatedly in the first horizontal direction DR1 and the second horizontal direction DR2.

The row driver 630 may be coupled to the rows of the pixel array 620 to generate signals for driving the rows. For example, the row driver 630 may drive the pixels in the pixel array 620 row by row.

The analog-to-digital conversion circuit 640 may be coupled to the columns of the pixel array 620 to convert the analog signals from the pixel array 620 to digital signals. As illustrated in FIG. 6, the analog-to-digital conversion circuit 640 may include a plurality of analog-to-digital converters (ADC) 641 to perform analog-to-digital conversion of the analog signals output from the column lines COL in parallel or simultaneously.

The analog-to-digital conversion circuit 640 may include a correlated double sampling (CDS) unit. In some example embodiments, the CDS unit may perform an analog double sampling by extracting a valid image component based on a difference between an analog reset signal and an analog image signal. In some example embodiments, the CDS unit may perform a digital double sampling by converting the analog reset signal and the analog image signal to two digital signals and extracting a difference between the two digital signals as the valid image component. In some example embodiments, the CDS unit may perform a dual CDS by performing both the analog double sampling and digital double sampling.

The column driver 650 may output the digital signals from the analog-to-digital conversion circuit 640 sequentially as output data Dout.

The controller 660 may control the row driver 630, the analog-to-digital conversion circuit 640, the column driver 650, and the reference signal generator 670. The controller 660 may provide control signals such as clock signals, timing control signals, etc. required for the operations of the row driver 630, the analog-to-digital conversion circuit 640, the column driver 650, and the reference signal generator 670. The controller 660 may include a control logic circuit, a phase-locked loop, a timing control circuit, a communication interface circuit, etc.

The reference signal generator 670 may generate a reference signal or a ramp signal that increases or decreases gradually and provide the ramp signal to the analog-to-digital conversion circuit 640.

Figure 7:
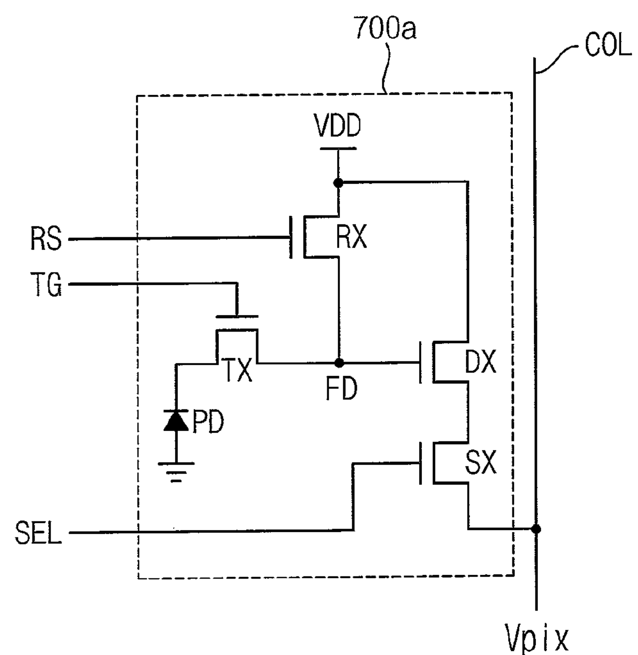
FIG. 7 is a circuit diagram illustrating an example of a pixel included in an image sensor according to example embodiments.

FIG. 7 is a circuit diagram illustrating an example of a pixel included in an image sensor according to example embodiments.

Referring to FIG. 7, a unit pixel 700*a* may include a photo-sensitive element such as a photodiode PD, and a readout circuit including a transfer transistor TX, a reset transistor RX, a drive transistor DX and/or a selection transistor SX.

For example, the photodiode PD may include an n-type region in a p-type substrate such that the n-type region and the p-type substrate form a p-n conjunction diode. The photodiode PD receives the incident light and generates a photo-charge based on the incident light. In some example embodiments, the unit pixel 700*a* may include a phototransistor, a photogate, and/or a pinned photodiode, etc. instead of, or in addition to, the photodiode PD.

The photo-charge generated in the photodiode PD may be transferred to a floating diffusion node FD through the transfer transistor TX. The transfer transistor TX may be turned on in response to a transfer control signal TG.

The drive transistor DX functions as a source follower amplifier that amplifies a signal corresponding to the charge on the floating diffusion node FD. The selection transistor SX may transfer the pixel signal Vpix to a column line COL in response to a selection signal SEL.

The floating diffusion node FD may be reset by the reset transistor RX. For example, the reset transistor RX may discharge the floating diffusion node FD in response to a reset signal RS for correlated double sampling (CDS).

FIG. 7 illustrates the unit pixel 700*a* of a four-transistor configuration including the four transistors TX, RX, DX and SX. The configuration of the unit pixel may be variously changed and the pixel structure is not limited to that of FIG. 7.

Figure 8:
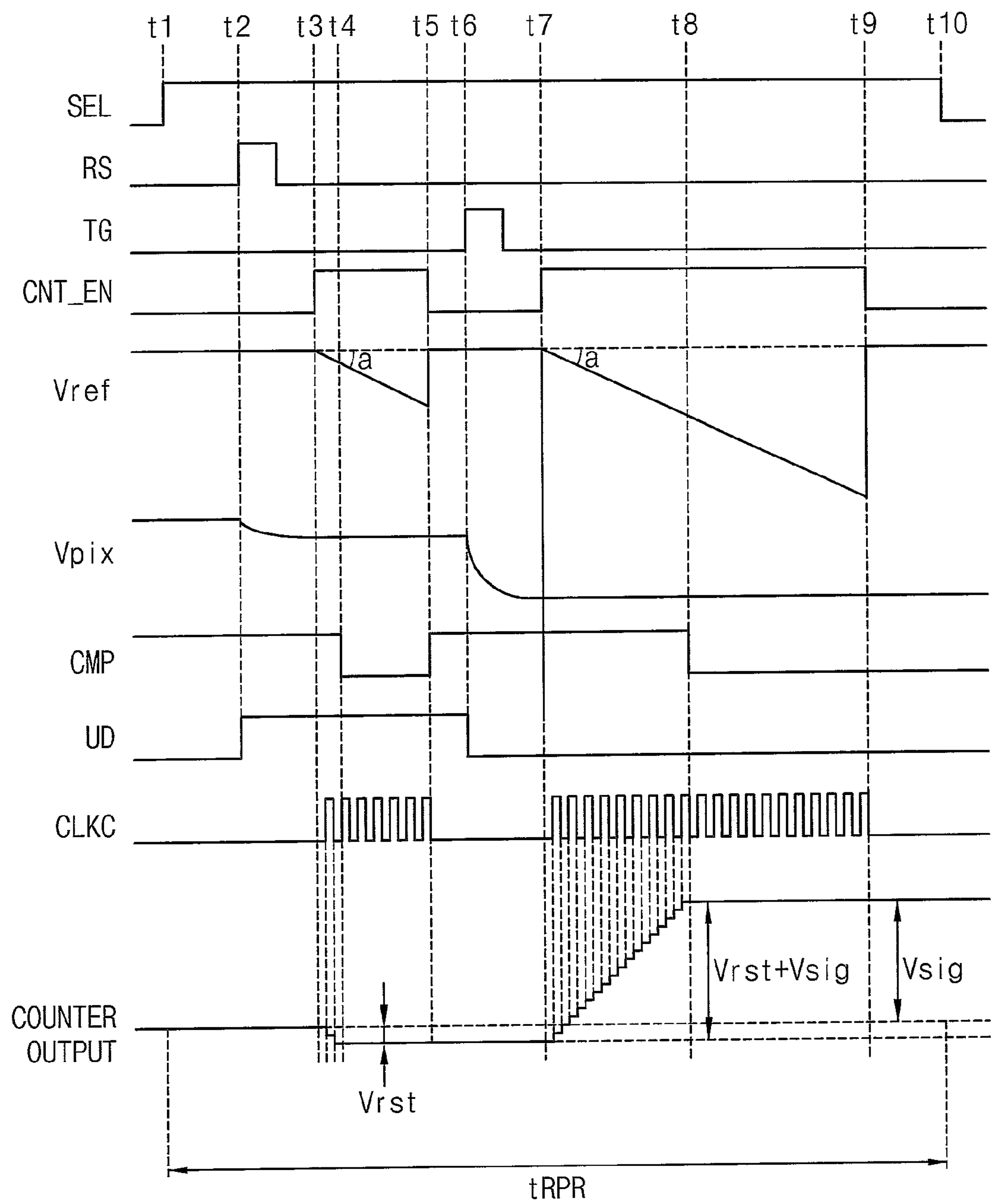
FIG. 8 is a timing diagram illustrating an example operation of an image sensor according to example embodiments.

FIG. 8 is a timing diagram illustrating an example operation of an image sensor according to example embodiments.

FIG. 8 illustrates a sensing period tRPR corresponding to a sensing operation of a pixel. The sensing operation may be performed simultaneously with respect to pixels corresponding to the same transfer control signal TG.

Referring to FIGS. 6, 7 and 8, at a time t1, the row driver 630 may select one of rows included in the pixel array 620 by providing an activated row selection signal SEL to the selected row of the pixel array 620. Here, for example, the row selection signal SEL may transition from low to high.

At a time t2, the row driver 630 may provide an activated reset control signal RS to the selected row, and the controller 660 may provide an up-down control signal UD having a logic high level to a counter included in the ADC 641. From the time t2, the pixel array 620 may output a first analog signal corresponding to a reset component Vrst as the pixel voltage Vpix.

At a time t3, the controller 660 may provide a count enable signal CNT_EN having a logic high level to the reference signal generator 670, and the reference signal generator 670 may start to decrease the reference signal Vref at the constant rate, e.g., a slope of 'a'. The controller 660 may provide a count clock signal CLKC to the counter included in the ADC 641, and the counter may perform down-counting from zero in synchronization with the count clock signal CLKC.

At a time t4, a magnitude of the reference signal Vref may become smaller than a magnitude of the pixel voltage Vpix, and a comparator included in the ADC 641 may provide a comparison signal CMP having a logic low level to the counter so that the counter stops performing the down-counting. At the time t4, a counter output of the counter may be the first counting value that corresponds to the reset component Vrst. In the example of FIG. 6, the counter output of the counter at the time t4 may be −2.

At a time t5, the controller 660 may provide the count enable signal CNT_EN having a logic low level to the reference signal generator 670, and the reference signal generator 670 may stop generating the reference signal Vref.

A period from the time t3 to the time t5 corresponds to a maximum time for detecting the reset component Vrst. A length of the period from the time t3 to the time t5 may be determined as a certain number of the count clock signal CLKC according to a characteristic of the image sensor 600.

At a time t6, the row driver 630 may provide an activated transfer control signal TG (e.g., the transfer control signal TG having a logic high level) to the selected row, and the controller 660 may provide the up-down control signal UD having a logic low level to the counter. From the time t6, the pixel array 620 may output a second analog signal corresponding to a detected incident light Vrst+Vsig as the pixel voltage Vpix.

At a time t7, the controller 660 may provide the count enable signal CNT_EN having a logic high level to the reference signal generator 670, and the reference signal generator 670 may start to decrease the reference signal Vref at the same constant rate as at the time t3, e.g., a slope of 'a'. The comparator in the ADC 641 may provide the comparison signal CMP having a logic high level to the counter since the pixel voltage Vpix is smaller than the reference signal Vref. The controller 660 may provide the count clock signal CLKC to the counter, and the counter may perform an up-counting from the first counting value, which corresponds to the reset component Vrst, in synchronization with the count clock signal CLKC.

At a time t8, the magnitude of the reference signal Vref may become smaller than the magnitude of the pixel voltage Vpix, and the comparator may provide the comparison signal CMP having a logic low level to the counter so that the counter stops performing the up-counting. At the time t8, the counter output of the counter may correspond to a difference between the first analog signal representing the reset component Vrst (e.g., −2 in the example of FIG. 6) and the second analog signal representing the detected incident light Vrst+Vsig (e.g., 17 in the example of FIG. 8). The difference may be an effective intensity of incident light Vsig (e.g., 15 in the example of FIG. 8). The counter may output the effective intensity of incident light Vsig as the digital signal.

At a time t9, the controller 660 may provide the count enable signal CNT_EN having a logic low level to the reference signal generator 670, and the reference signal generator 670 may stop generating the reference voltage Vref.

A period from the time t7 to the time t9 corresponds to a maximum time for detecting the detected incident light Vrst+Vsig. A length of the period from the time t7 to the time t9 may be determined as a certain number of the count clock signal CLKC according to a characteristic of the image sensor 600.

At a time t10, the row driver 630 may provide a deactivated row selection signal SEL (e.g., the row selection signal having a low level) to the selected row of the pixel array 620, and the counter may reset the counter output to zero.

After that, the image sensor 600 may repeat above described operations on each row to generate the digital signals row by row.

The present disclosure is not limited to the example configuration and operation described with reference to FIGS. 6, 7 and 8.

Figure 9:
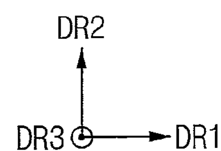
FIG. 9 is a diagram illustrating a layout of a pixel array according to example embodiments.

FIG. 9 is a diagram illustrating a layout of a pixel array according to example embodiments.

Referring to FIG. 9, the pixel array 620 in the image sensor 600 of FIG. 6 may be divided into unit patterns UPTT that are arranged repeatedly in the first horizontal direction DR1 and the second horizontal direction DR2. Each unit pattern UPTT may include two or more pixel groups where each pixel group may include a plurality of unit pixels sharing a color filter as described above.

In some example embodiments, all of the unit patterns UPTT in the pixel array 620 may be identical. For example, the unit pattern UPTT may be a minimum pattern that cannot be divided into smaller patterns. In some example embodiments, the unit patterns UPTT in the pixel array 620 may include two or more different patterns such that the different patterns are arranged regularly in the first horizontal direction DR1 and/or the second horizontal direction DR2.

Hereinafter, various color filter array and unit patterns according to example embodiments are described with reference to FIGS. 10A through 12. The unit pattern may be inverted in the first horizontal direction DR1 and/or the second horizontal direction DR2, or the unit pattern may be rotated around the vertical direction by 90 degrees or 180 degrees.

In FIGS. 10A through 12, a unit pixel corresponding to a red filter is referred to as a red pixel R, a unit pixel corresponding to a green filter is referred to as a green pixel G, a unit pixel corresponding to a blue filter is referred to as a blue pixel B, a unit pixel corresponding to a yellow filter is referred to as a yellow pixel Y, and a unit pixel corresponding to a cyan filter is referred to as a cyan pixel C. For a pixel group PXGij, i indicates an index of a corresponding group row, and j indicates an index of a corresponding group column. When the unit pixels in each pixel group correspond to the same color, the unit pixels in each pixel group may share a single color filter CF.

FIGS. 10A through 10E are plan views illustrating example embodiments of a unit pattern of a 4*4 size included in a pixel array according to example embodiments.

Referring to FIGS. 10A through 10E, each of unit patterns UPTT1~UPTT5 having a 4*4 size may include first through fourth pixel groups PXG11~PXG22 arranged in a matrix form of two group rows GR1 and GR2 and two group columns GC1 and GC2. Each of the first through fourth pixel groups PXG11~PXG22 may include four unit pixels arranged in a matrix form of two pixel rows and two pixel columns.

Figure 10A:
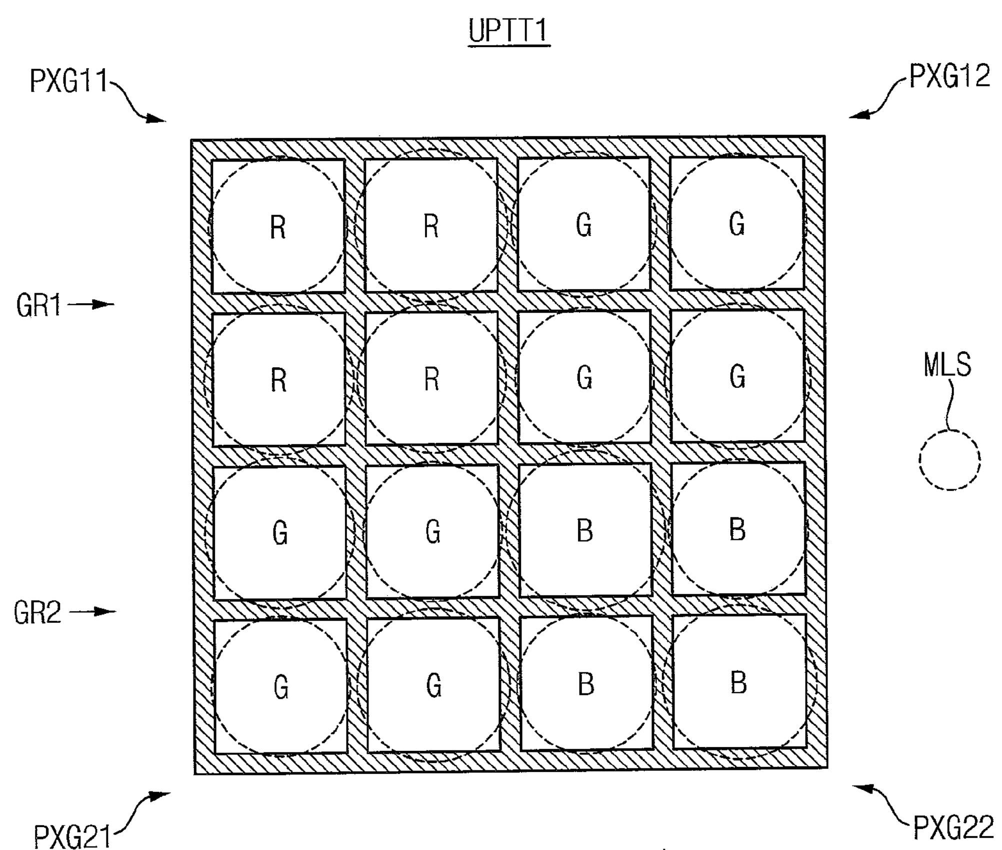
FIGS. 10A through 10E are plan views illustrating example embodiments of a unit pattern of a 4*4 size included in a pixel array according to example embodiments.

In some example embodiments, as the unit pattern UPTT1 illustrated in FIG. 10A, the first pixel group PXG11 may include four red pixels R, each of the second and third pixel groups PXG12 and PXG21 may include four green pixels G, and the fourth pixel group PXG22 may include four blue pixels B.

Figure 10B:
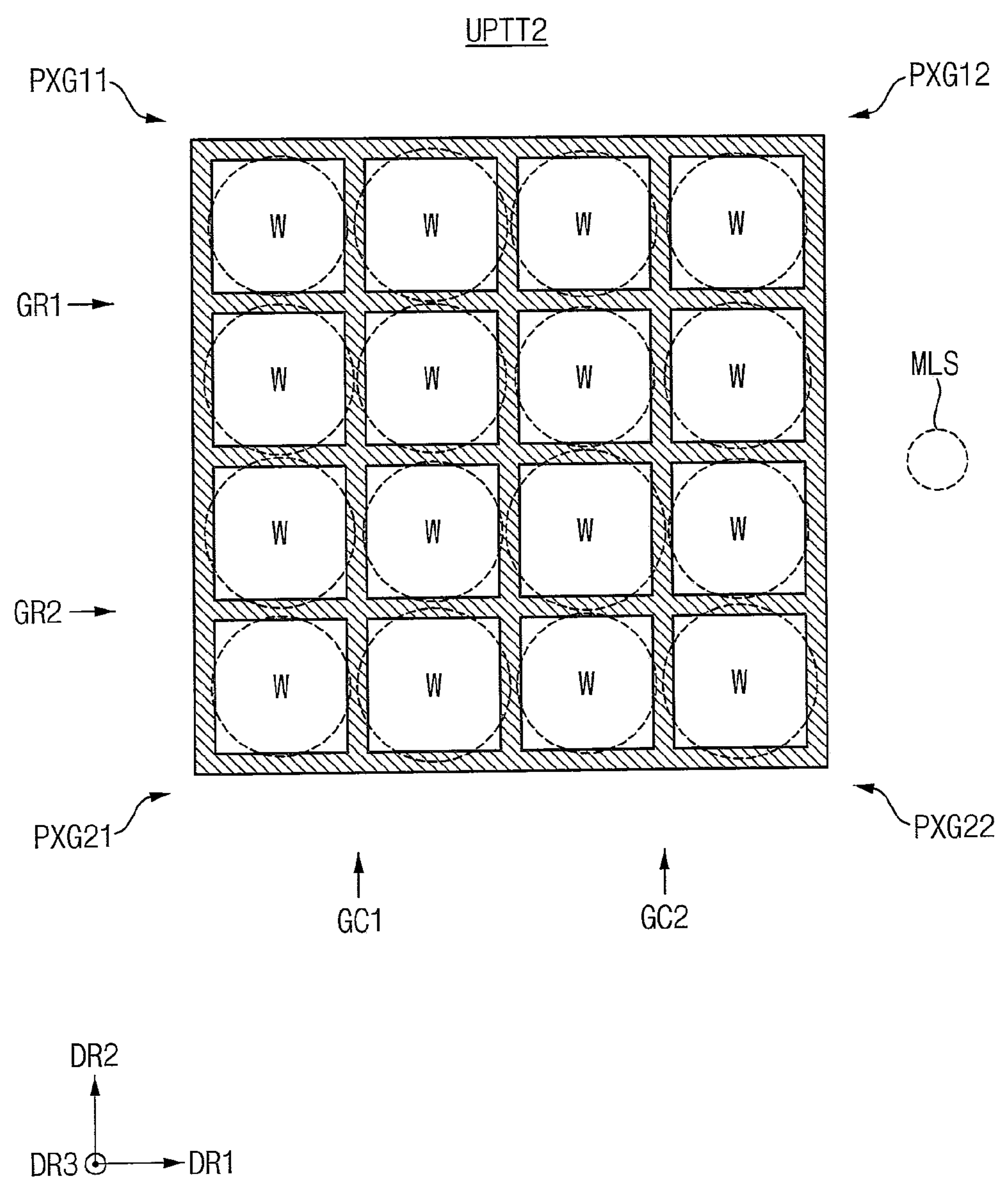

In some example embodiments, as the unit pattern UPTT2 illustrated in FIG. 10B, each of the first through fourth pixel groups PXG11~PXG22 may include four white pixels W.

Figure 10C:
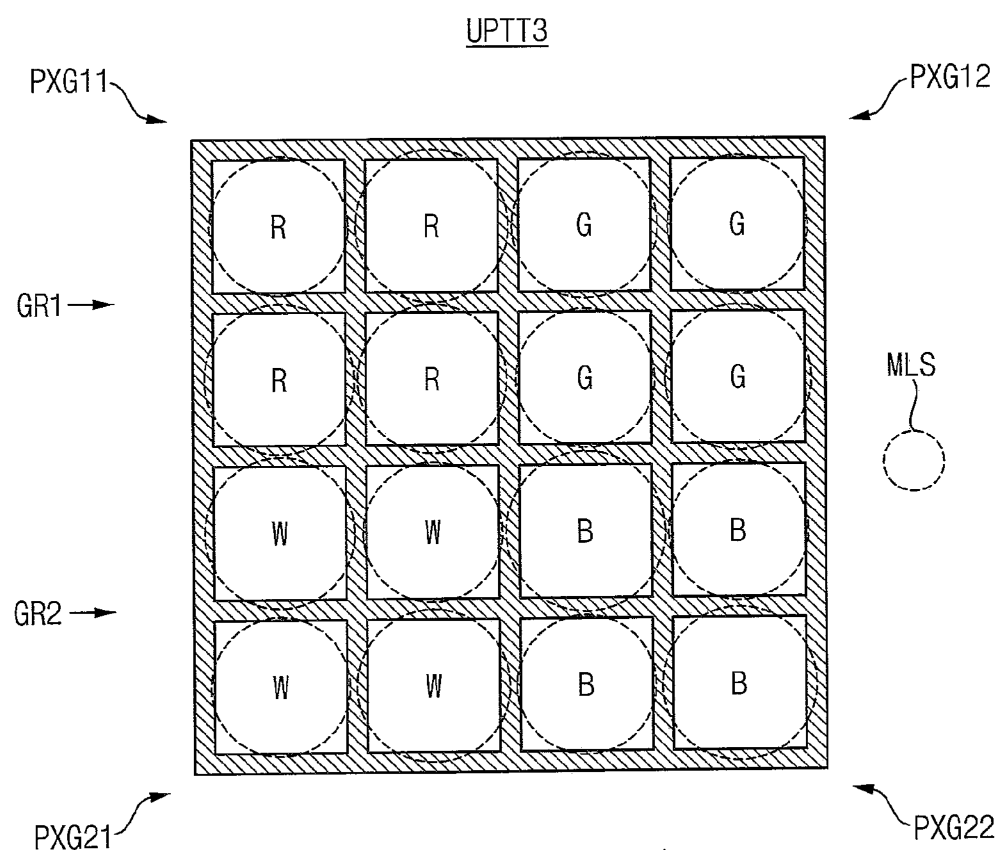

In some example embodiments, as the unit pattern UPTT3 illustrated in FIG. 10C, the first pixel group PXG11 may include four red pixels R, the second pixel group PXG12 may include four green pixels G, the third pixel group PXG21 may include four white pixels W, and the fourth pixel group PXG22 may include four blue pixels B.

Figure 10D:
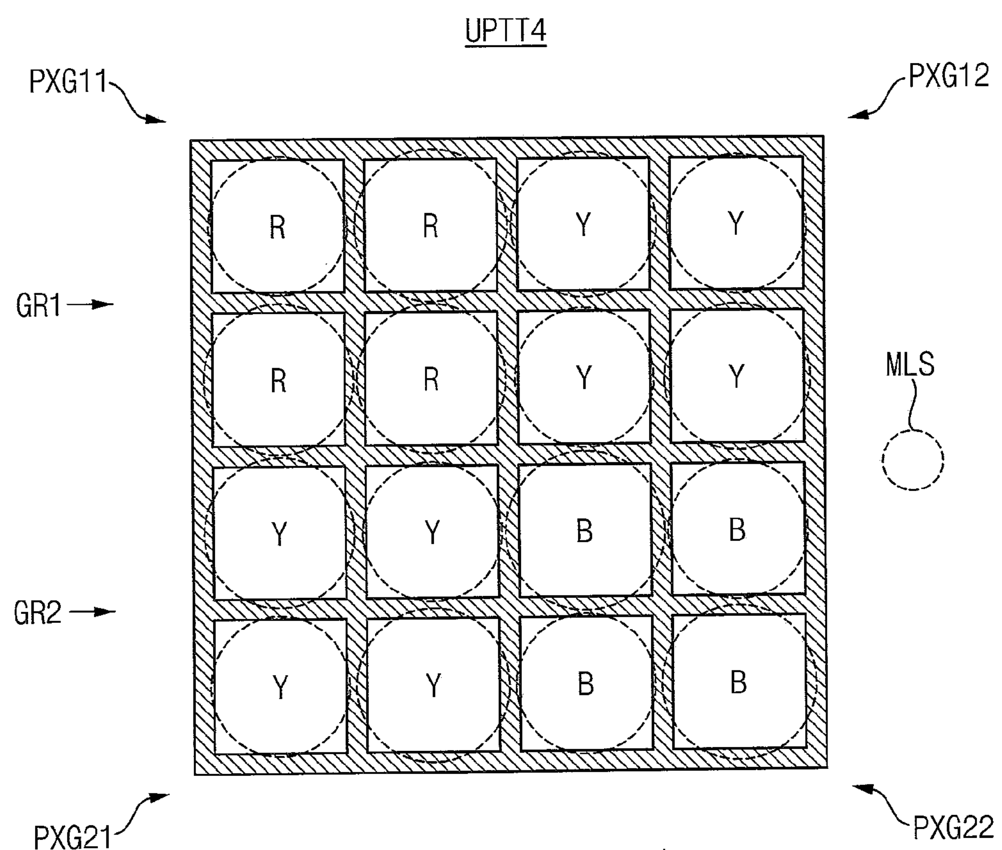

In some example embodiments, as the unit pattern UPTT4 illustrated in FIG. 10D, the first pixel group PXG11 may include four red pixels R, each of the second and third pixel groups PXG12 and PXG21 may include four yellow pixels Y, and the fourth pixel group PXG22 may include four blue pixels B.

Figure 10E:
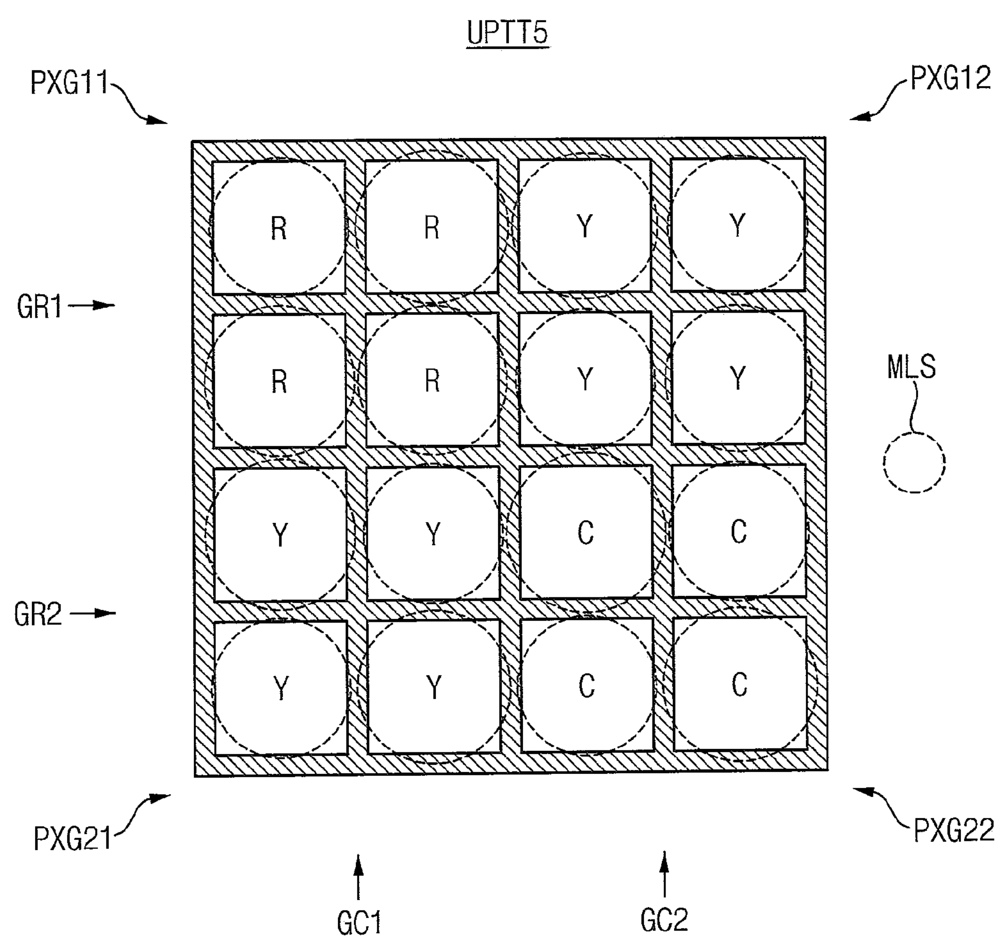

In some example embodiments, as the unit pattern UPTT5 illustrated in FIG. 10E, the first pixel group PXG11 may include four red pixels R, each of the second and third pixel groups PXG12 and PXG21 may include four yellow pixels Y, and the fourth pixel group PXG22 may include four cyan pixels C.

In some example embodiments of the present disclosure, although not illustrated in figures, the first pixel group PXG11 may include two red pixels R and two white pixels W, each of the second and third pixel groups PXG12 and PXG21 may include two green pixels G and two white pixels W, and the fourth pixel group PXG22 may include two blue pixels B and two white pixels W.

Figure 11A:
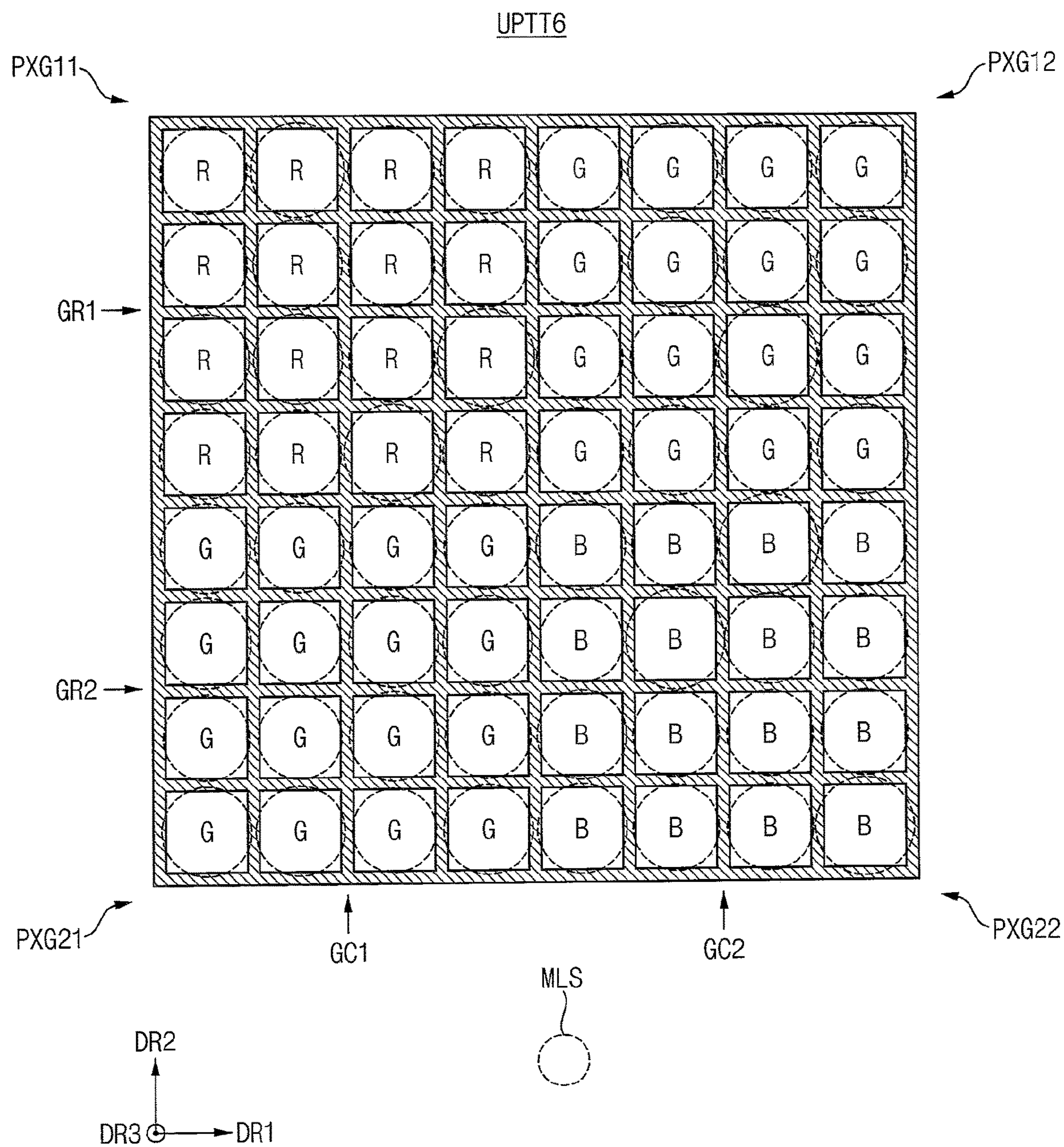
FIGS. 11A, 11B and 11C are plan views illustrating example embodiments of a unit pattern of an 8*8 size included in a pixel array according to example embodiments.
Figure 11B:
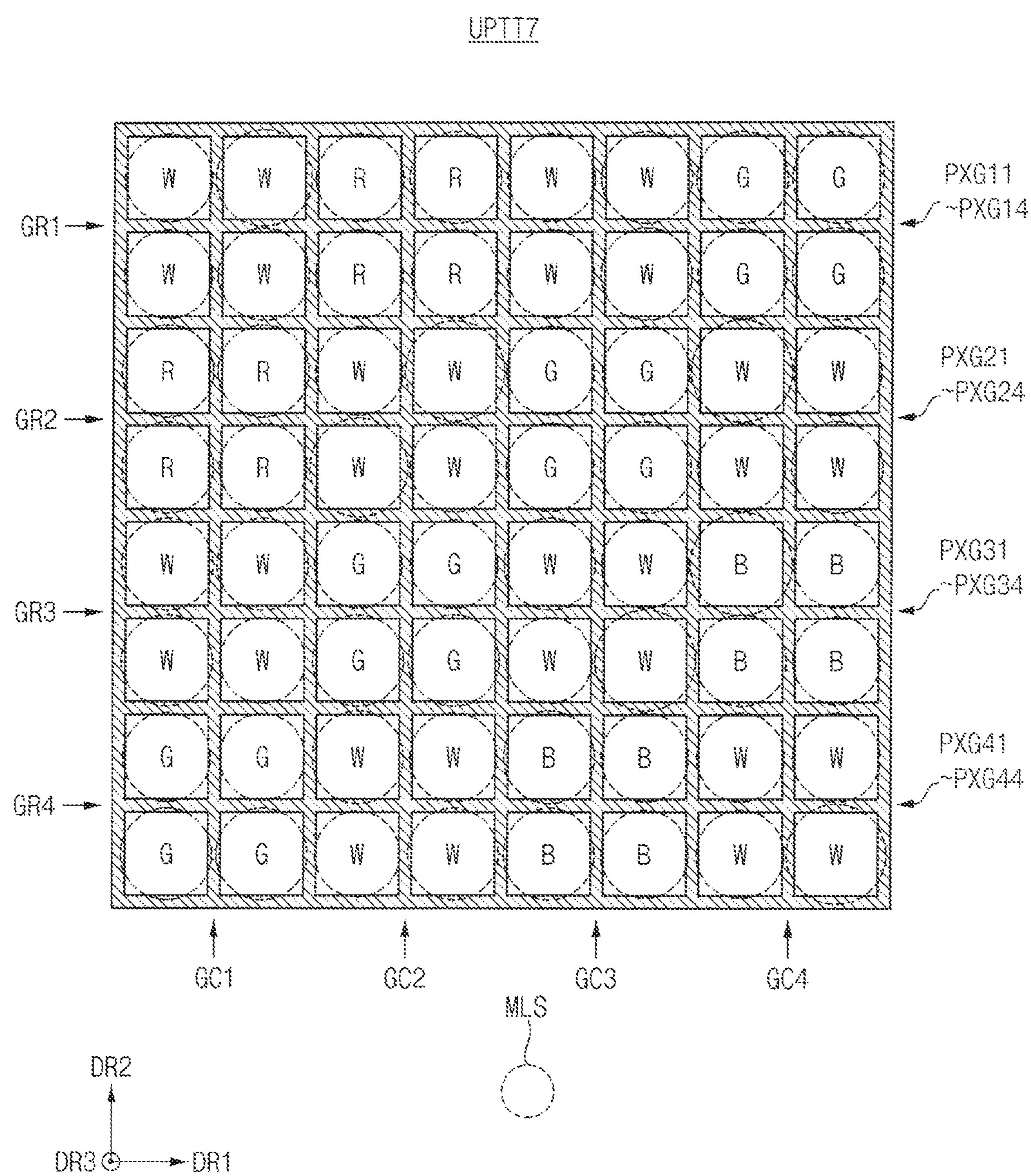
Figure 11C:
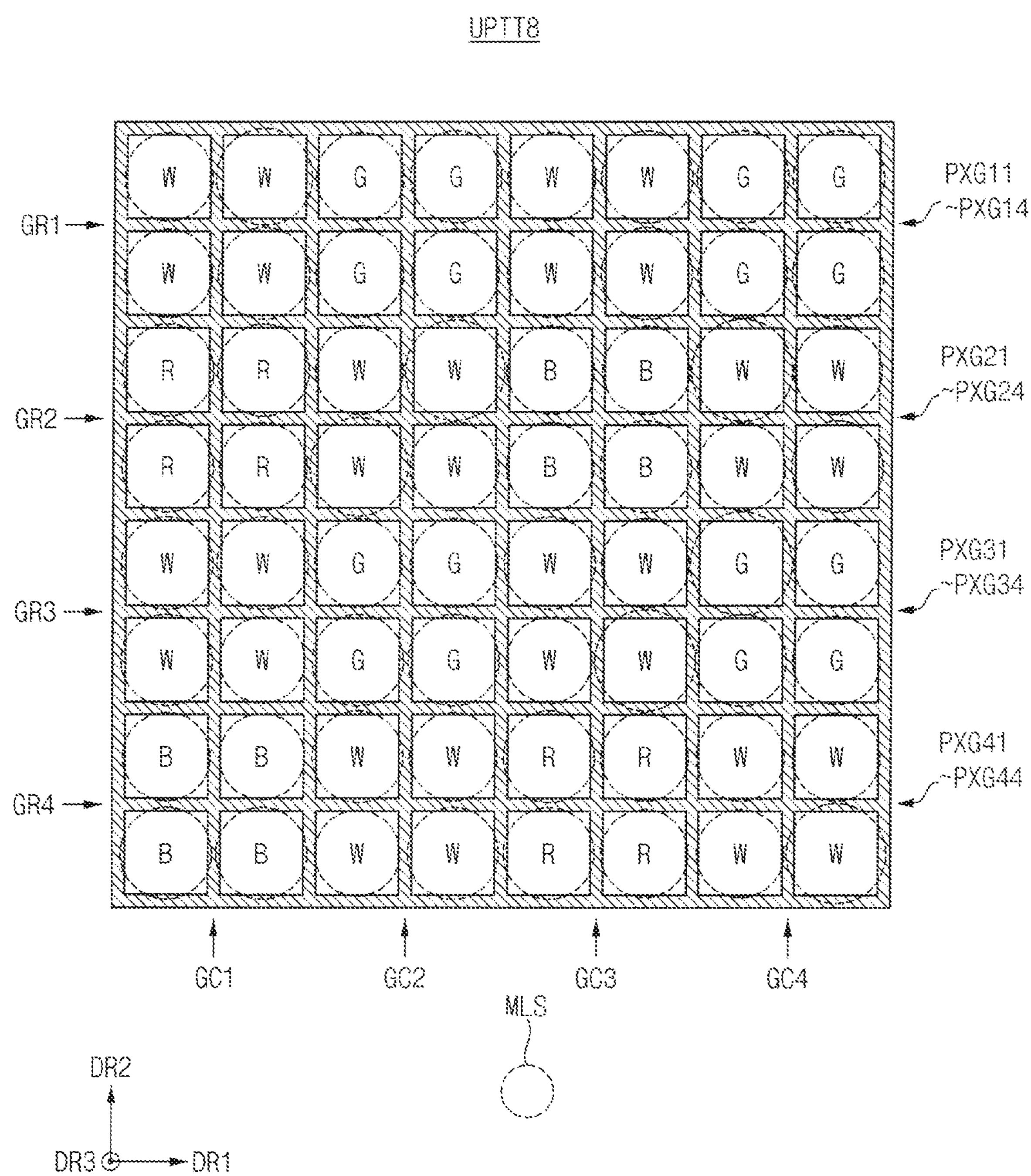

FIGS. 11A, 11B and 11C are plan views illustrating example embodiments of a unit pattern of an 8*8 size included in a pixel array according to example embodiments.

Referring to FIG. 11A, a unit pattern UPTT6 having a 8*8 size may include first through fourth pixel groups PXG11~PXG22 arranged in a matrix form of two group rows GR1 and GR2 and two group columns GC1 and GC2. Each of the first through fourth pixel groups PXG11~PXG22 may include sixteen unit pixels arranged in a matrix form of four pixel rows and four pixel columns.

In some example embodiments, as the unit pattern UPTT6 illustrated in FIG. 11A, the first pixel group PXG11 may include sixteen red pixels R, each of the second and third pixel groups PXG12 and PXG21 may include sixteen green pixels G, and the fourth pixel group PXG22 may include sixteen blue pixels B.

Referring to FIGS. 11B and 11C, each of unit patterns UPTT7 and UPTT8 having a 8*8 size may include first through sixteenth pixel groups PXG11~PXG44 arranged in a matrix form of first through fourth group rows GR1~GR4 and first through fourth group columns GC1~GC4. The first through fourth pixel groups PXG11, PXG12, PXG21 and PXG22 may be arranged in a matrix form of the first and second group rows GR1 and GR2 and the first and second group columns GC1 and GC2. The fifth through eighth pixel groups PXG13, PXG14, PXG23 and PXG24 may be arranged in a matrix form of the first and second group rows GR1 and GR2 and the third and fourth group columns GC3 and GC4. The ninth through twelfth pixel groups PXG31, PXG32, PXG41 and PXG42 may be arranged in a matrix form of the third and fourth group rows GR3 and GR4 and the first and second group columns GC1 and GC2. The thirteenth through sixteenth pixel groups PXG33, PXG34, PXG43 and PXG44 may be arranged in a matrix form of the third and fourth group rows GR3 and GR4 and the third and fourth group columns GC3 and GC4. Each of the first through sixteenth pixel groups PGX11~PGX44 may include four unit pixels arranged in a matrix form of two pixel rows and two pixel columns.

In some example embodiments, as the unit pattern UPTT7 illustrated in FIG. 11B, each of the first, fourth, fifth, eighth, ninth, twelfth, thirteenth and sixteenth pixel groups PXG11, PXG22, PXG13, PXG24, PXG31, PXG42, PXG33 and PXG44 may include four white pixels W, each of the second and third pixel groups PXG12 and PXG21 may include four red pixels R, each of the sixth, seventh, tenth and eleventh pixel groups PXG14, PXG23, PXG32 and PXG41 may include four green pixels G, and each of the fourteenth and fifteenth pixel groups PXG34 and PXG43 may include four blue pixels B.

In some example embodiments, as the unit pattern UPTT8 illustrated in FIG. 11C, each of the first, fourth, fifth, eighth, ninth, twelfth, thirteenth and sixteenth pixel groups PXG11, PXG22, PXG13, PXG24, PXG31, PXG42, PXG33 and PXG44 may include four white pixels W, each of the third and fifteenth pixel groups PXG21 and PXG43 may include four red pixels R, each of the second, sixth, tenth and fourteenth pixel groups PXG12, PXG14, PXG32 and PXG34 may include four green pixels G, and each of the seventh and eleventh pixel groups PXG23 and PXG41 may include four blue pixels B.

Figure 12:
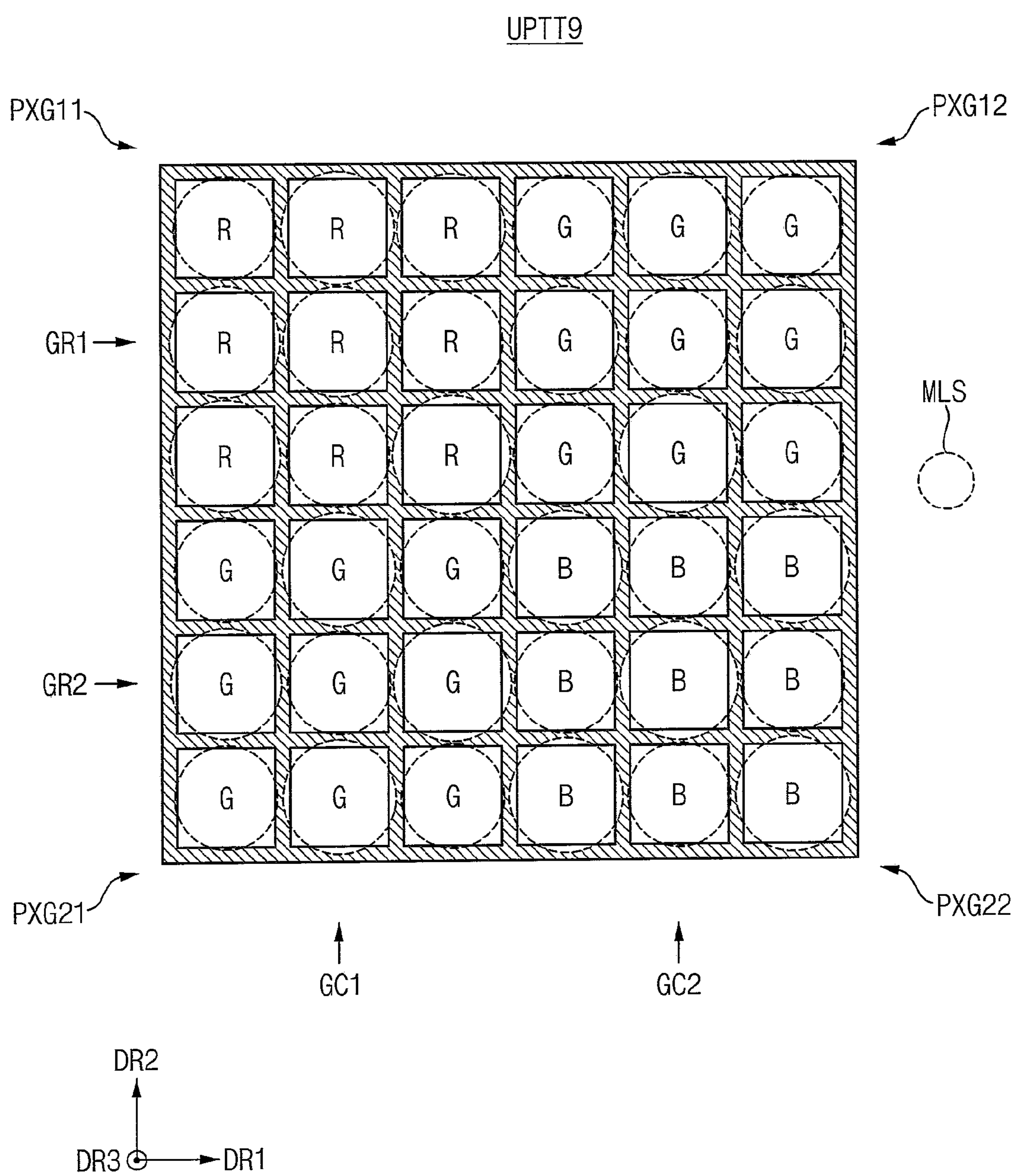
FIG. 12 is a plan view illustrating an example embodiment of a unit pattern of a 6*6 size included in a pixel array according to example embodiments.

FIG. 12 is a plan view illustrating an example embodiment of a unit pattern of a 6*6 size included in a pixel array according to example embodiments.

Referring to FIG. 12, a unit pattern UPTT9 having a 6*6 size may include first through fourth pixel groups PXG11~PXG22 arranged in a matrix form of two group rows GR1 and GR2 and two group columns GC1 and GC2. Each of the first through fourth pixel groups PXG11~PXG22 may include nine unit pixels arranged in a matrix form of three pixel rows and three pixel columns.

In some example embodiments, as the unit pattern UPTT9 illustrated in FIG. 12, the first pixel group PXG11 may include nine red pixels R, each of the second and third pixel groups PXG12 and PXG21 may include nine green pixels G, and the fourth pixel group PXG22 may include nine blue pixels B.

Figure 13:
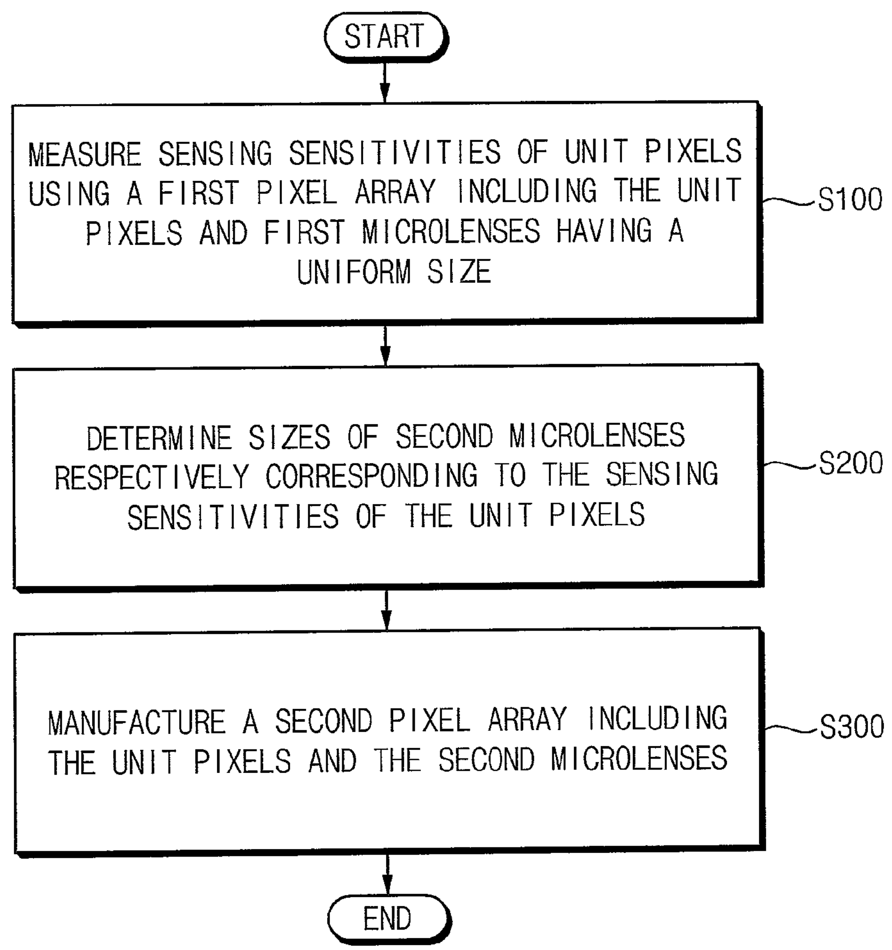
FIG. 13 is a flowchart illustrating a method of manufacturing a pixel array of an image sensor according to example embodiments.
Figure 14:
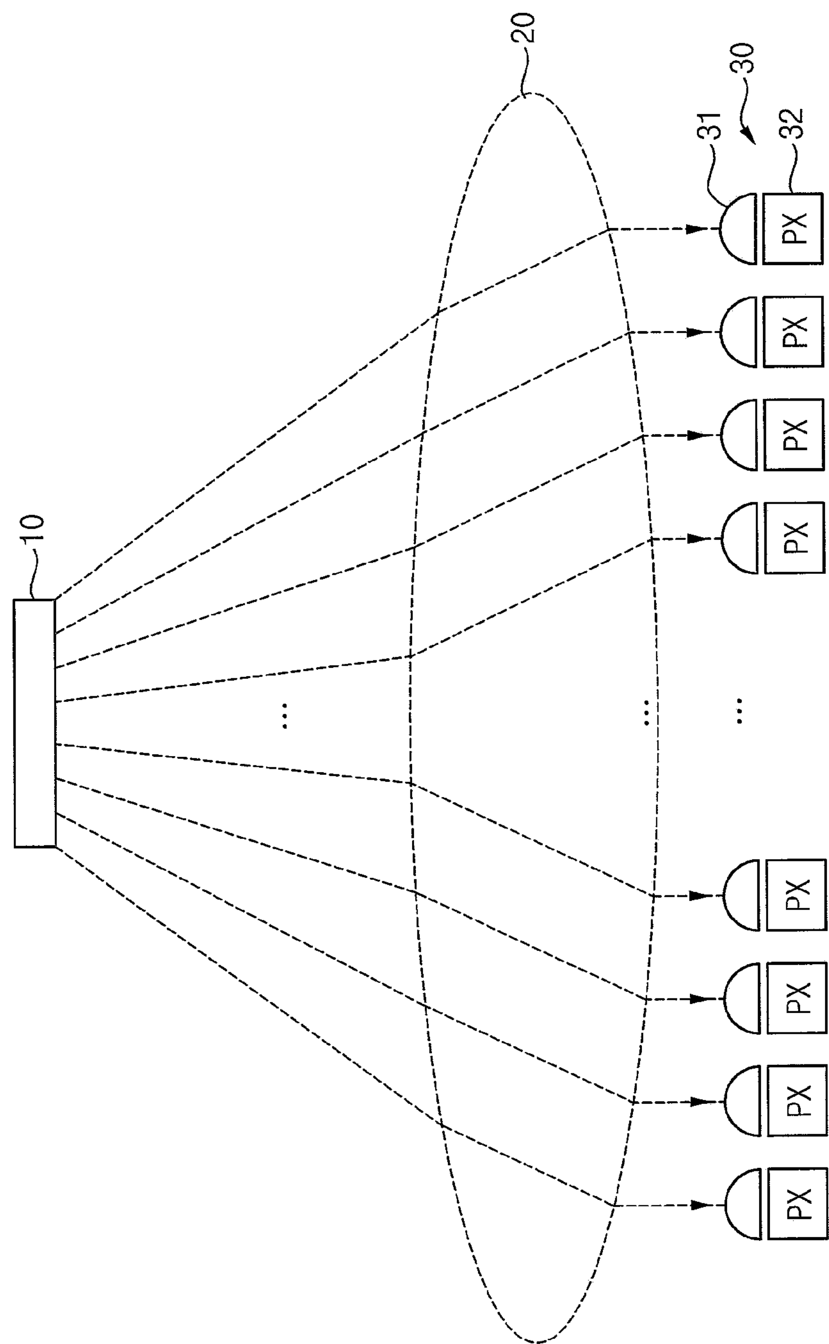
FIG. 14 is a diagram illustrating an example embodiment of measuring sensing sensitivity of unit pixels for the method of FIG. 13.

FIG. 13 is a flowchart illustrating a method of manufacturing a pixel array of an image sensor according to example embodiments, and FIG. 14 is a diagram illustrating an example embodiment of measuring sensing sensitivity of unit pixels for the method of FIG. 13.

Referring to FIGS. 13 and 14, sensing sensitivities of unit pixels may be measured using a first pixel array including the unit pixels and first microlenses having a uniform size (S100).

For example, as illustrated in FIG. 14, an incident light having uniform intensity may be generated using a surface light source 10, and the incident light having the uniform intensity may be illuminated to a first pixel array 30 using an optical lens or a module lens 20 of an image sensor. The microlenses 31 and the unit pixels PX 32 included in the first pixel array 30 may have uniform sizes. For example, sizes of the microlenses 31 may be the same as each other, and sizes of the unit pixels PX 32 may be the same as each other.

Sizes of second microlenses respectively corresponding to the sensing sensitivities of the unit pixels may be determined (S200).

In some example embodiments, an average sensing sensitivity per color of unit pixels of the same color may be determined, and the sizes of the microlenses may be determined based on the average sensing sensitivity per color. In some example embodiments, a ratio of a sensing sensitivity of each unit pixel of the same color with respect to the average sensing sensitivity per color may be determined and a size of each microlens corresponding to each unit pixel may be determined such that the size of each microlens is inversely proportional to the ratio.

A second pixel array including the unit pixels and the second microlenses may be manufactured (S300). As described with reference to FIGS. 4A, 4B and 4C, mask patterns having sizes respectively corresponding to the sensing sensitivities of the unit pixels may be formed and the second microlenses may be formed by performing a reflow process and an etchback process using the mask patterns.

Figure 15:
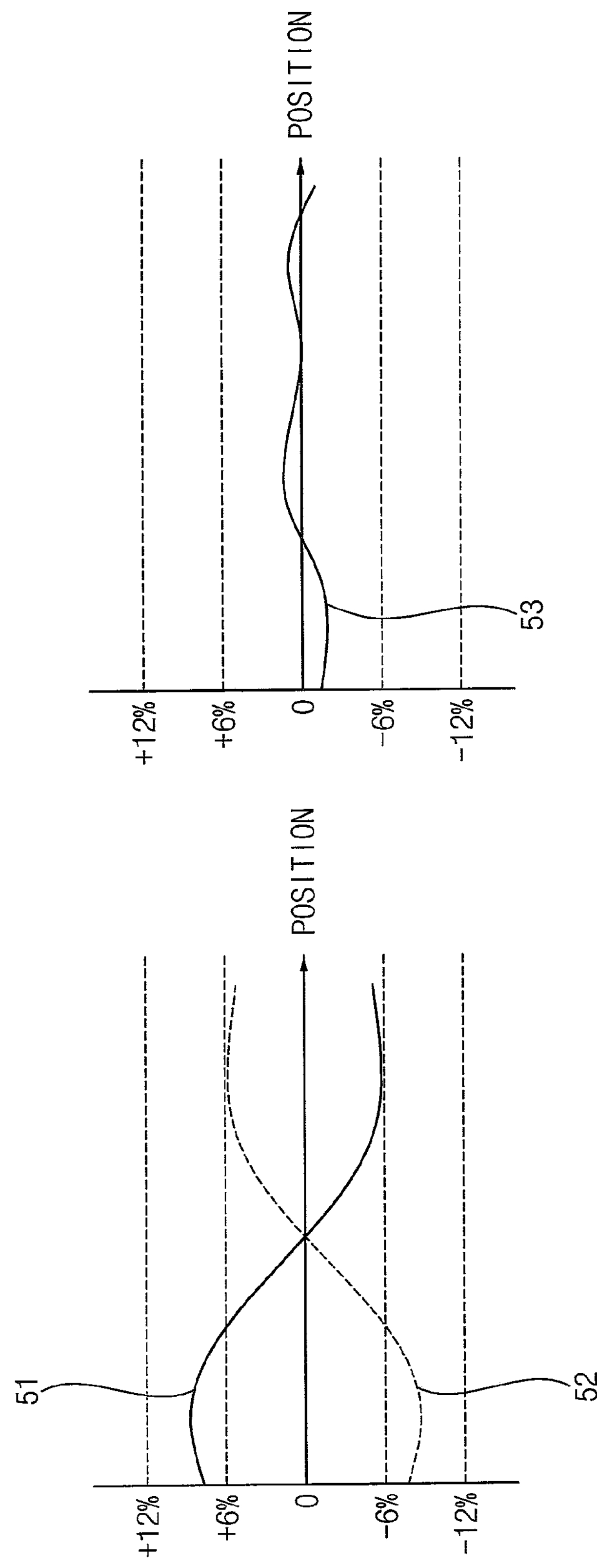
FIG. 15 is a diagram illustrating reduction of sensing sensitivity difference between pixels according to example embodiments.

FIG. 15 is a diagram illustrating reduction of sensing sensitivity between pixels according to example embodiments.

In FIG. 15, the horizontal axis indicates a position of each pixel group of the same color in a pixel array, and the vertical axis indicates a ratio of a group sensing sensitivity of each pixel group with respect to an entire average sensing sensitivity of the pixel groups of the same color or a ratio of a group average size of microlenses in each pixel group with respect to an entire average size of microlenses in the pixel groups of the same color.

FIG. 15 illustrates a first sensing sensitivity distribution 51, a size distribution 52 and a second sensing sensitivity distribution 53. The first sensing sensitivity distribution 51 corresponds to the group average sensing sensitivities measured using the first pixel array including the first microlenses of the uniform size. The size distribution 52 corresponds to the group average sizes of the second pixel array including the second microlenses having the sizes corresponding to the measured sensing sensitivities of the unit pixels. The second sensing sensitivity distribution 53 corresponds to the group average sensing sensitivities measured using the second pixel array including the second microlenses of the sizes determined according to example embodiments.

A plurality of pixel groups included in a pixel array may include a first pixel group and a second pixel group disposed at different positions of the pixel array and respectively including color filters of the same color. For example, the first pixel group may be positioned at the left portion of the distribution 51 and the second pixel group may be positioned at the right portion of the distribution 51.

In this case, the plurality of unit pixels included in the first pixel group may have a first group average sensing sensitivity and the plurality of unit pixels included in the second pixel group may have a second group average sensing sensitivity lower than the first group average sensing sensitivity.

As illustrated in FIG. 15, the size distribution 52 of the microlenses included in the second pixel array may be symmetric with the first sensing sensitivity distribution 51 with respect to the horizontal line of ratio "0" corresponding to the entire average sensing sensitivity or the entire average size. For example, the group average size of the microlenses of each pixel group in the second pixel array may be determined to be inversely proportional to the group sensing sensitivity of each pixel group. As such, a first group average size of the plurality of microlenses included in the first pixel group may be smaller than a second group average size of the plurality of microlenses included in the second pixel group.

As illustrated in FIG. 15, compared with the first sensing sensitivity distribution 51, the second sensing sensitivity distribution 53 may approach the horizontal line of ratio "0", and thus deviations of the sensing sensitivity of the second pixel array may be reduced compared with the first pixel array.

Figure 16:
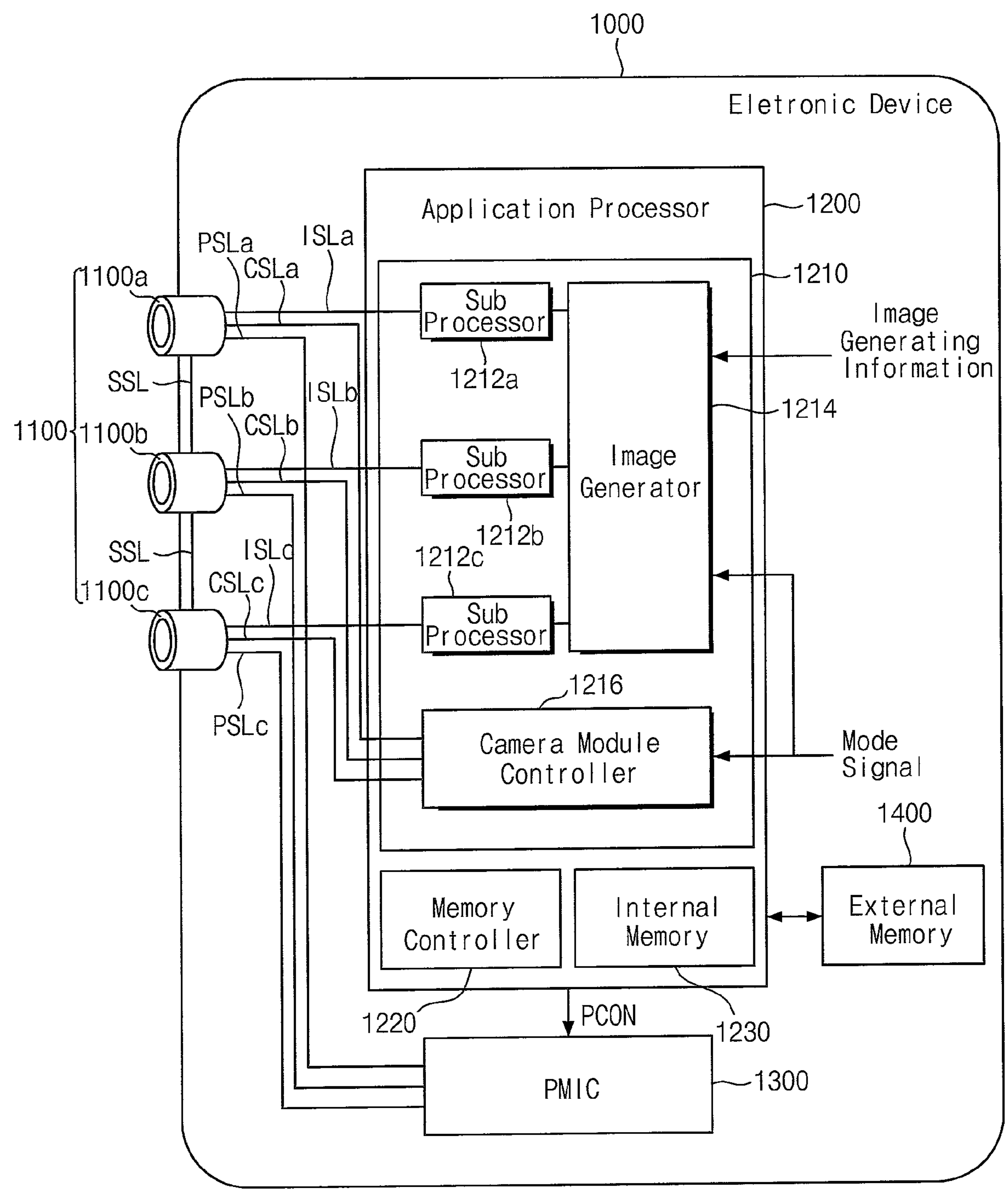
FIG. 16 is a block diagram illustrating an electronic device according to example embodiments.
Figure 17:
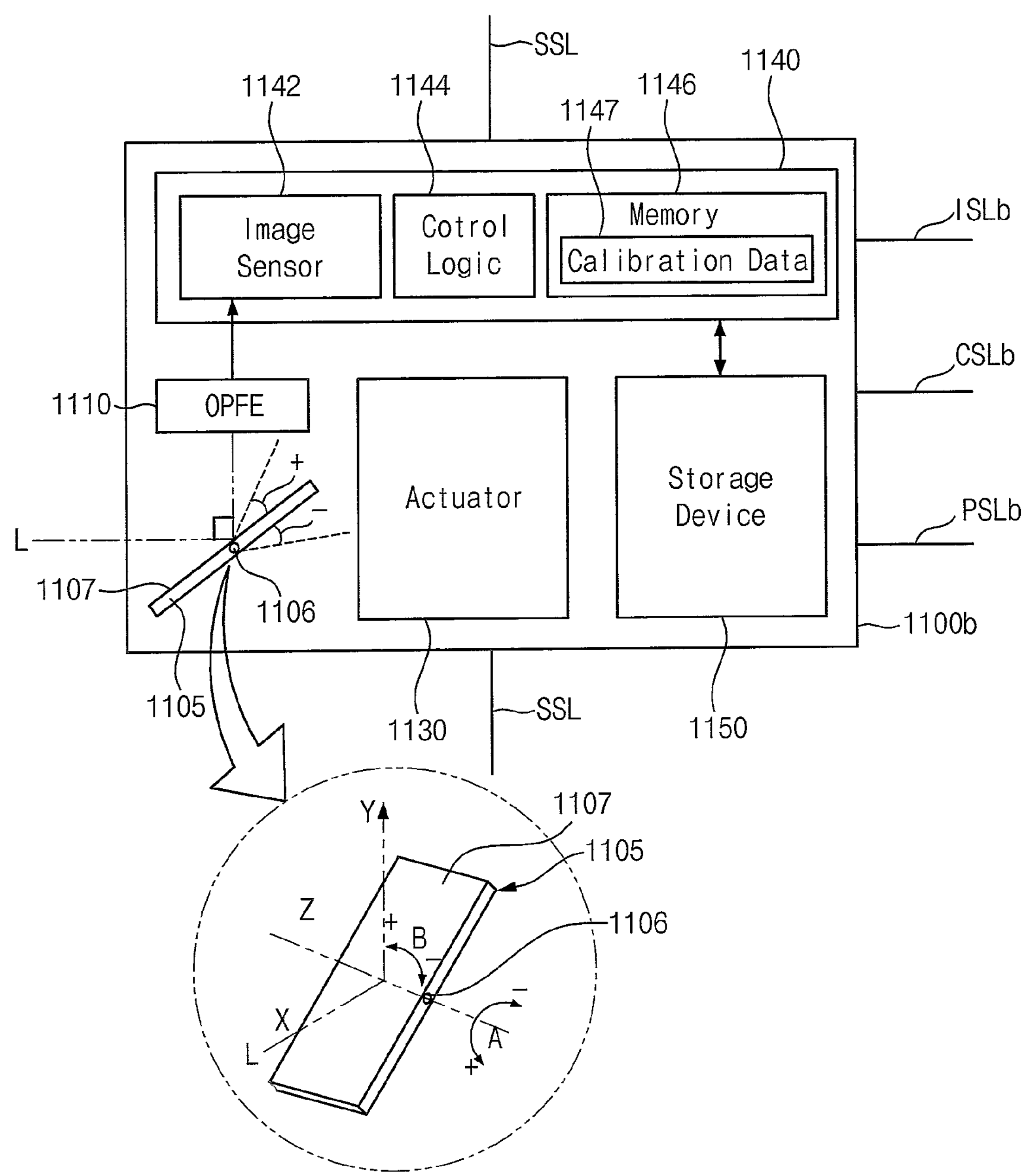
FIG. 17 is a block diagram illustrating a camera module included in the electronic device of FIG. 16.

FIG. 16 is a block diagram illustrating an electronic device according to example embodiments, and FIG. 17 is a block diagram illustrating a camera module included in the electronic device of FIG. 16.

Referring to FIG. 16, an electronic device 1000 may include a camera module group 1100, an application processor 1200, a power management integrated circuit (PMIC) 1300 and an external memory 1400.

The camera module group 1100 may include a plurality of camera modules 1100*a*, 1100*b* and 1100*c*. FIG. 16 illustrates three camera modules 1100*a*, 1100*b* and 1100*c* as an example, but example embodiments are not limited to a particular number of camera modules. According to example embodiments, the camera module group 1100 may include two camera modules, or four or more camera modules.

Hereinafter, an example configuration of the camera module 1100*b* is described with reference to FIG. 17. According to example embodiments, the same descriptions may be applied to the other camera modules 1100*a* and 1100*c*.

Referring to FIG. 17, the camera module 1100*b* may include a prism 1105, an optical path folding element (OPFE) 1110, an actuator 1130, an image sensing device 1140 and a storage device 1150.

The prism 1105 may include a reflection surface 1107 to change a path of a light L incident on the prism 1105.

In some example embodiment, the prism 1105 may change the path of the light L incident in a first direction X to a second direction Y perpendicular to the first direction X. In addition, the prism 1105 may rotate the reflection surface 1107 around a center axis 1106, e.g., in an A direction shown in FIG. 17, and/or rotate the center axis 1106 in a B direction shown in FIG. 17 to align the path of the reflected light along the second direction Y. For example, the directions A and B may be orthogonal. In addition, the OPFE 1110 may move in a third direction perpendicular to the first direction X and the second direction Y.

In some example embodiment, a rotation angle of the prism 1105 may be smaller than 15 degrees in the positive (+) A direction and greater than 15 degrees in the negative (−) A direction, but example embodiments are not limited thereto.

In some example embodiment, the prism 1105 may rotate within 20 degrees in the positive B direction and the negative B direction.

In some example embodiment, the prism 1105 may move the reflection surface 1107 in the third direction Z that is in parallel with the center axis 1106.

The OPFE 1110 may include optical lenses that are divided into m groups where m is a positive integer. The m lens group may move in the second direction Y to change an optical zoom ratio of the camera module 1100*b*. For example, the optical zoom ratio may be changed in a range of 3K, 5K, and so on by moving the m lens group, when K is a basic optical zoom ratio of the camera module 1100*b*.

The actuator 1130 may move the OPFE 1110 or the optical lens to a specific position. For example, the actuator 1130 may adjust the position of the optical lens for accurate sensing such that an image sensor 1142 may be located at a position corresponding to a focal length of the optical lens.

The image sensing device 1140 may include the image sensor 1142, a control logic 1144 and a memory 1146. The image sensor 1142 may capture or sense an image using the light provided through the optical lens. The control logic 1144 may control overall operations of the camera module 1100*b*. For example, the control logic 1144 may provide control signals through control signal line CSLb to control the operation of the camera module 1100*b*.

The memory 1146 may store information such as calibration data 1147 for the operation of the camera module 1100*b*. For example, the calibration data 1147 may include information for generation of image data based on the provided light, such as information on the above-described rotation angle, a focal length, information on an optical axis, and so on. When the camera module 1100*b* is implemented as a multi-state camera having a variable focal length depending on the position of the optical lens, the calibration data 1147 may include multiple focal length values and auto-focusing values corresponding to the multiple states.

The storage device 1150 may store the image data sensed by using the image sensor 1142. The storage device 1150 may be disposed outside of the image sensing device 1140, and the storage device 1150 may be stacked with a sensor chip comprising the image sensing device 1140. The storage device 1150 may be implemented with an electrically erasable programmable read-only memory (EEPROM), but example embodiments are not limited thereto.

Referring to FIGS. 16 and 17, each of the camera modules 1100*a*, 1100*b* and 1100*c* may include an actuator 1130. In this case, the camera modules 1100*a*, 1100*b* and 1100*c* may include the same or different calibration data 1147 depending on the operations of the actuators 1130.

In some example embodiments, one camera module 1100*b* may have a folded lens structure included the above-described prism 1105 and the OPFE 1110, and the other camera modules 1100*a* and 1100*b* may have a vertical structure without the prism 1105 and the OPFE 1110.

In some example embodiments, one camera module 1100*c* may be a depth camera configured to measure distance information of an object using an infrared light. In this case, the application processor 1200 may merge the distance information provided from the depth camera 1100*c* and image data provided from the other camera modules 1100*a* and 1100*b* to generate a three-dimensional depth image.

In some example embodiments, at least two camera modules among the camera modules 1100*a*, 1100*b* and 1100*c* may have different field of views from each other, for example, through different optical lenses.

In some example embodiments, each of the camera modules 1100*a*, 1100*b* and 1100*c* may be separated physically from each other. For example, the camera modules 1100*a*, 1100*b* and 1100*c* may each include a dedicated image sensor 1142.

The application processor 1200 may include an image processing device 1210, a memory controller 1220 and an internal memory 1230. The application processor 1200 may be separated from the camera modules 1100*a*, 1100*b* and 1100*c*. For example, the application processor 1200 may be implemented as one chip and the camera modules 1100*a*, 1100*b* and 1100*c* may be implemented as another chip or other chips.

The image processing device 1210 may include a plurality of sub processors 1212*a*, 1212*b* and 1212*c*, an image generator 1214 and a camera module controller 1216.

The image data generated by the camera modules 1100*a*, 1100*b* and 1100*c* may be provided and/or electrically connected to the sub processors 1212*a*, 1212*b* and 1212*c* through distinct image signal lines ISLa, ISLb and ISLc, respectively. For example, the transfer of the image data may be performed using a camera serial interface (CSI) based on the mobile industry processor interface (MIPI), but example embodiments are not limited thereto.

In some example embodiments, one sub processor may be assigned commonly to two or more camera modules. In this case, a multiplexer may be used to transfer the image data selectively from one of the camera modules to the shared sub processor.

The image data from the sub processors 1212*a*, 1212*b* and 1212*c* may be provided to the image generator 1214. The image generator 1214 may generate an output image using the image data from the sub processors 1212*a*, 1212*b* and 1212*c* according to image generating information or a mode signal. For example, the image generator 1214 may merge at least a portion of the image data from the camera modules 1100*a*, 1100*b* and 1100*c* having different field of views to generate the output image according to the image generating information or the mode signal. In addition, the image generator 1214 may select, as the output image, one of the image data from the camera modules 1100*a*, 1100*b* and 1100*c* according to the image generating information or the mode signal.

In some example embodiments, the image generating information may include a zoom factor or a zoom signal. In some example embodiments, the mode signal may be a signal based on a selection of a user.

When the image generating information is the zoom factor and the camera modules 1100*a*, 1100*b* and 1100*c* have the different field of views, the image generator 1214 may perform different operations depending on the zoom signal. For example, when the zoom signal is a first signal, the image generator 1214 may merge the image data from the different camera modules to generate the output image. When the zoom signal is a second signal different from the first signal, the image generator 1214 may select, as the output image, one of image data from the camera modules 1100*a*, 1100*b* and 1100*c*.

In some example embodiments, the image generator 1214 may receive the image data of different exposure times from the camera modules 1100*a*, 1100*b* and 1100*c*. In this case, the image generator 1214 may perform high dynamic range (HDR) processing with respect to the image data from the camera modules 1100*a*, 1100*b* and 1100*c* to generate the output image having the increased dynamic range.

The camera module controller 1216 may provide control signals to the camera modules 1100*a*, 1100*b* and 1100*c*. The control signals generated by the camera module controller 1216 may be provided to the camera modules 1100*a*, 1100*b* and 1100*c* through the distinct control signal lines CSLa, CSLb and CSLc, respectively.

In some example embodiments, one of the camera modules 1100*a*, 1100*b* and 1100*c* may be designated as a master camera according to the image generating information or the mode signal, and the other camera modules may be designated as slave cameras.

The camera module acting as the master camera may be changed according to the zoom factor or an operation mode signal. For example, when the camera module 1100*a* has the wider field of view than the camera module 1100*b* and the zoom factor indicates a lower zoom magnification, the camera module 1100*b* may be designated as the master camera. In contrast, when the zoom factor indicates a higher zoom magnification, the camera module 1100*a* may be designated as a master camera.

In some example embodiments, the control signals provided from the camera module controller 1216 may include a synch enable signal. For example, when the camera module 1100*b* is the master camera and the camera modules 1100*a* and 1100*c* are the slave cameras, the camera module controller 1216 may provide the synch enable signal to the camera module 1100*b*. The camera module 1100*b* may generate a synch signal based on the provided synch enable signal and provide the synch signal to the camera modules 1100*a* and 1100*c* through a synch signal line SSL. As such, the camera modules 1100*a*, 1100*b* and 1100*c* may transfer the synchronized image data to the application processor 1200 based on the synch signal.

In some example embodiments, the control signals provided from the camera module controller 1216 may include information on the operation mode. The camera modules 1100*a*, 1100*b* and 1100*c* may operate in a first operation mode or a second operation mode based on the information received from the camera module controller 1216.

In the first operation mode, the camera modules 1100*a*, 1100*b* and 1100*c* may generate image signals with a first speed (e.g., a first frame rate) and encode the image signals with a second speed higher than the first speed (e.g., a second frame rate higher than the first frame rate) to transfer the encoded image signals to the application processor 1200. The second speed may be lower than thirty times the first speed. The application processor 1200 may store the encoded image signals in the internal memory 1230 or the external memory 1400. The application processor 1200 may read out and decode the encoded image signals to provide display data to a display device. For example, the sub processors 1212*a*, 1212*b* and 1212*c* may perform the decoding operation and the image generator 1214 may process the decoded image signals.

In the second operation mode, the camera modules 1100*a*, 1100*b* and 1100*c* may generate image signals with a third speed lower than the first speed (e.g., the third frame rate lower than the first frame rate) to transfer the generated image signals to the application processor 1200. For example, the image signals that are not encoded may be provided to the application processor 1200. The application processor 1200 may process the received image signals or store the received image signals in the internal memory 1230 or the external memory 1400.

The PMIC 1300 may provide a power supply voltage to each of the camera modules 1100*a*, 1100*b* and 1100*c*. For example, the PMIC 1300 may provide, under control of the application processor 1200, a first power to the camera module 1100*a* through a power line PSLa, a second power to the camera module 1100*b* through a power line PSLb, and a third power to the camera module 1100*c* through a power line PSLc.

The PMIC 1300 may generate the power respectively corresponding to the camera modules 1100*a*, 1100*b* and 1100*c* and control power levels, in response to a power control signal PCON from the application processor 1200. The power control signal PCON may include information on the power depending on the operation modes of the camera modules 1100*a*, 1100*b* and 1100*c*. For example, the operation modes may include a low power mode in which the camera modules 1100*a*, 1100*b* and 1100*c* operate in low powers. The power levels of the camera modules 1100*a*, 1100*b* and 1100*c* may be the same as or different from each other. In addition, the power levels may be changed dynamically or adaptively.

As described above, the pixel array, the image sensor and the manufacturing method according to example embodiments may reduce deviations of sensing sensitivity of unit pixels and enhance quality of images captured by the image sensor by adjusting sizes of microlenses.

The present disclosure may be applied to any electronic devices and systems including an image sensor. For example, the present disclosure may be applied to systems such as a mobile phone, a smart phone, a personal digital assistant (PDA), a portable multimedia player (PMP), a digital camera, a camcorder, a personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, a vehicle navigation device, a video phone, a monitoring system, an auto focusing system, a tracking system, a motion detection system, etc.

The foregoing is illustrative of example embodiments of the present disclosure and is not to be construed as limiting thereof. Although a few example embodiments have been described, those skilled in the art will readily appreciate that many modifications are possible in the example embodiments without materially departing from the present disclosure.

What is claimed is:

1. A pixel array of an image sensor, comprising:
a plurality of pixel groups, each pixel group comprising:
a plurality of unit pixels adjacent to each other and respectively including photoelectric conversion elements disposed in a semiconductor substrate;
a color filter shared by the plurality of unit pixels, so that the plurality of unit pixels are the same color pixels; and
a plurality of microlenses disposed on the color filter and having sizes different from each other, the plurality of microlenses configured to respectively focus an incident light to the photoelectric conversion elements included in the plurality of unit pixels.

2. The pixel array of claim 1, wherein each microlens of the plurality of microlenses has a size that is inversely proportional to a sensing sensitivity of each unit pixel of the plurality of unit pixels corresponding to each microlens.

3. The pixel array of claim 1, wherein a microlens corresponding to a unit pixel having a sensing sensitivity lower than an average sensing sensitivity of the plurality of unit pixels has a size greater than an average size of the plurality of microlenses, and a microlens corresponding to a unit pixel having a sensing sensitivity higher than the average sensing sensitivity has a size smaller than the average size.

4. The pixel array of claim 1, wherein the plurality of unit pixels include a first unit pixel having a first sensing sensitivity and a second unit pixel having a second sensing sensitivity lower than the first sensing sensitivity, wherein the plurality of microlenses include a first microlens configured to focus the incident light to a photoelectric conversion element included in the first unit pixel and a second microlens configured to focus the incident light to a photoelectric conversion element included in the second unit pixel, and wherein a size of the first microlens is smaller than a size of the second microlens.

5. The pixel array of claim 1, wherein the plurality of pixel groups include a first pixel group and a second pixel group disposed at different positions of the pixel array and respectively including color filters of the same color, wherein the plurality of unit pixels included in the first pixel group have a first group average sensing sensitivity and the plurality of unit pixels included in the second pixel group have a second group average sensing sensitivity lower than the first group average sensing sensitivity, and wherein a first group average size of the plurality of microlenses included in the first pixel group is smaller than a second group average size of the plurality of microlenses included in the second pixel group.

6. The pixel array of claim 1, wherein the plurality of unit pixels have the same size and the plurality of microlenses have sizes respectively corresponding to sensing sensitivities of the plurality of unit pixels.

7. The pixel array of claim 1, further comprising:

trench structures disposed in the semiconductor substrate and extending in a vertical direction from an upper surface of the semiconductor substrate to a lower surface of the semiconductor substrate to electrically and optically separate the photoelectric conversion elements from each other included in the plurality of unit pixels.

8. The pixel array of claim 7, wherein each trench structure includes:

an upper trench structure formed by a front trench process from the upper surface of the semiconductor substrate; and a lower trench structure formed by a back trench process from the lower surface of the semiconductor substrate.

9. The pixel array of claim 8, wherein the upper trench structure has a structure or a composition different from the lower trench structure.

10. The pixel array of claim 1, wherein the pixel array is divided into unit patterns that are arranged repeatedly in a first horizontal direction and a second horizontal direction perpendicular to the first horizontal direction, and each unit pattern includes two or more pixel groups.

11. The pixel array of claim 10, wherein at least one of the unit patterns includes first through fourth pixel groups that are arranged in a matrix of two group rows and two group columns, and wherein each of the first through fourth pixel groups includes four unit pixels arranged in a matrix of two pixel rows and two pixel columns.

12. The pixel array of claim 11, wherein the first pixel group includes four red pixels, each of the second and third pixel groups includes four green pixels and the fourth pixel group includes four blue pixels.

13. The pixel array of claim 10, wherein at least one of the unit patterns includes first through fourth pixel groups that are arranged in a matrix of two group rows and two group columns, and wherein each of the first through fourth pixel groups includes nine unit pixels arranged in a matrix of three pixel rows and three pixel columns.

14. The pixel array of claim 13, wherein the first pixel group includes nine red pixels, each of the second and third pixel groups includes nine green pixels and the fourth pixel group includes nine blue pixels.

15. The pixel array of claim 10, wherein at least one of the unit patterns includes:

first, second, third and fourth pixel groups that are arranged in a matrix of a first group row, a second group row, a first group column and a second group column;

fifth, sixth, seventh and eighth pixel groups that are arranged in a matrix of the first group row, the second group row, a third group column and a fourth group column;

ninth, tenth, eleventh and twelfth pixel groups that are arranged in a matrix of a third group row, a fourth group row, the first group column and the second group column; and thirteenth, fourteenth, fifteenth and sixteenth pixel groups that are arranged in a matrix of the third group row, the fourth group row, the third group column and the fourth group column.

16. An image sensor, comprising:

a pixel array including a plurality of pixel groups configured to collect photo-induced charges generated by an incident light;

a row driver configured to drive the pixel array row by row; and a controller configured to control the pixel array and the row driver, each pixel group comprising:

a plurality of unit pixels adjacent to each other and respectively including photoelectric conversion elements disposed in a semiconductor substrate;

a color filter shared by the plurality of unit pixels; and a plurality of microlenses disposed on the color filter and having sizes different from each other, the plurality of microlenses configured to respectively focus the incident light to the photoelectric conversion elements included in the plurality of unit pixels, wherein the color filter has the same color throughout the color filter so that the color filter having the same color vertically overlaps the plurality of microlenses having sizes different from each other.

17. The image sensor of claim 16, wherein each microlens of the plurality of microlenses has a size that is inversely proportional to a sensing sensitivity of each unit pixel of the plurality of unit pixels corresponding to each microlens.

18. A method of manufacturing a pixel array of an image sensor, comprising:

measuring sensing sensitivities of unit pixels using a first pixel array including the unit pixels and first microlenses having a uniform size;

determining sizes of second microlenses respectively corresponding to the sensing sensitivities of the unit pixels; and manufacturing a second pixel array including the unit pixels and the second microlenses.

19. The method of claim 18, wherein determining the sizes of the second microlenses includes:

determining average sensing sensitivity per color of unit pixels of the same color;

determining a ratio of a sensing sensitivity of each unit pixel of the same color with respect to the average sensing sensitivity per color; and determining a size of each microlens corresponding to each unit pixel such that the size of each microlens is inversely proportional to the ratio.

20. The method of claim 18, wherein manufacturing the second pixel array includes:

forming mask patterns having sizes respectively corresponding to the sensing sensitivities of the unit pixels; and forming the second microlenses by performing a reflow process and an etchback process using the mask patterns.

* * * * *